(12) United States Patent
Fukuhara et al.

(10) Patent No.: US 12,500,568 B2
(45) Date of Patent: *Dec. 16, 2025

(54) ACOUSTIC WAVE DEVICE WITH MULTI-LAYER SUBSTRATE INCLUDING CERAMIC

(71) Applicant: Skyworks Solutions, Inc., Irvine, CA (US)

(72) Inventors: Hironori Fukuhara, Ibaraki (JP); Rei Goto, Osaka (JP); Keiichi Maki, Suita (JP)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/653,234

(22) Filed: May 2, 2024

(65) Prior Publication Data

US 2024/0283424 A1 Aug. 22, 2024

Related U.S. Application Data

(60) Division of application No. 18/526,616, filed on Dec. 1, 2023, which is a continuation of application No.
(Continued)

(51) Int. Cl.
*H03H 9/02* (2006.01)
*H03H 3/10* (2006.01)
(Continued)

(52) U.S. Cl.
CPC .......... *H03H 9/02574* (2013.01); *H03H 3/10* (2013.01); *H03H 9/02031* (2013.01);
(Continued)

(58) Field of Classification Search
CPC .. H03H 9/02574; H03H 3/10; H03H 9/02031; H03H 9/02559; H03H 9/02834;
(Continued)

(56) References Cited

U.S. PATENT DOCUMENTS 3,955,160 A 5/1976 Duffy
5,233,259 A 8/1993 Kirshnaswamy et al.
(Continued)

FOREIGN PATENT DOCUMENTS

CN 112787620 5/2021
JP 2002-016468 1/2002
(Continued)

OTHER PUBLICATIONS

Ftouni et al., "Thermal conductivity of silicon nitride membranes is not sensitive to stress", American Physical Society, vol. 92(12):125439 (2015).
(Continued)

*Primary Examiner* — Hafizur Rahman
(74) *Attorney, Agent, or Firm* — Knobbe, Martens, Olson & Bear, LLP

(57) ABSTRACT

An acoustic wave device is disclosed. The acoustic wave device includes a support layer, a ceramic layer positioned over the support layer, a piezoelectric layer positioned over the ceramic layer, and an interdigital transducer electrode positioned over the piezoelectric layer. The support layer has a higher thermal conductivity than the ceramic layer. The ceramic layer can be a polycrystalline spinel layer. The acoustic wave device can be a surface acoustic wave device configured to generate a surface acoustic wave.

20 Claims, 21 Drawing Sheets

Related U.S. Application Data

16/800,248, filed on Feb. 25, 2020, now Pat. No. 11,876,501.

(60) Provisional application No. 62/810,649, filed on Feb. 26, 2019, provisional application No. 62/810,707, filed on Feb. 26, 2019.

(51) Int. Cl.
  *H03H 9/05* (2006.01)
  *H03H 9/145* (2006.01)
  *H03H 9/25* (2006.01)
  *H03H 9/64* (2006.01)
  *H03H 9/72* (2006.01)
  *H10N 30/072* (2023.01)

(52) U.S. Cl.
  CPC .... *H03H 9/02559* (2013.01); *H03H 9/02834* (2013.01); *H03H 9/0585* (2013.01); *H03H 9/14502* (2013.01); *H03H 9/25* (2013.01); *H03H 9/6406* (2013.01); *H03H 9/725* (2013.01); *H10N 30/072* (2023.02)

(58) Field of Classification Search
  CPC .... H03H 9/0585; H03H 9/14502; H03H 9/25; H03H 9/6406; H03H 9/725; H01L 41/312
  USPC ...................................................... 310/313 A
  See application file for complete search history.

(56) References Cited

U.S. PATENT DOCUMENTS

| | | | |
|---|---|---|---|
| 6,242,844 B1 | 6/2001 | Puttagunta et al. | |
| 6,510,597 B2 | 1/2003 | Yoshida et al. | |
| 6,555,946 B1 | 4/2003 | Finder et al. | |
| 7,105,980 B2 | 9/2006 | Abbott et al. | |
| 7,439,649 B2 | 10/2008 | Fujii et al. | |
| 7,510,906 B2 | 3/2009 | Chang et al. | |
| 7,659,796 B2 * | 2/2010 | Funami | H03H 9/725 333/133 |
| 8,258,895 B2 | 9/2012 | Ruile et al. | |
| 8,373,329 B2 | 2/2013 | Nakahashi | |
| 8,381,386 B2 * | 2/2013 | Kando | H03H 9/1078 29/25.35 |
| 8,614,535 B2 | 12/2013 | Tsuji et al. | |
| 8,677,604 B2 * | 3/2014 | Kando | H03H 9/1078 29/609.1 |
| 9,246,533 B2 | 1/2016 | Fujiwara et al. | |
| 9,276,558 B2 | 3/2016 | Kando | |
| 9,484,886 B2 | 11/2016 | Takemura | |
| 9,520,857 B2 | 12/2016 | Fujiwara et al. | |
| 10,389,332 B2 | 8/2019 | Bhattacharjee | |
| 10,700,662 B2 | 6/2020 | Miura et al. | |
| 10,749,497 B2 | 8/2020 | Tang et al. | |
| 10,778,187 B2 | 9/2020 | Takamine et al. | |
| 10,886,891 B2 | 1/2021 | Kuroyanagi et al. | |
| 11,245,378 B2 | 2/2022 | Tang et al. | |
| 11,258,427 B2 | 2/2022 | Kadota et al. | |
| 11,356,075 B2 | 6/2022 | Kadota et al. | |
| 11,621,690 B2 | 4/2023 | Fukuhara et al. | |
| 11,824,515 B2 | 11/2023 | Tang et al. | |
| 11,876,501 B2 * | 1/2024 | Fukuhara | H03H 9/725 |
| 12,063,027 B2 | 8/2024 | Goto et al. | |
| 2005/0151599 A1 | 7/2005 | Ido et al. | |
| 2005/0162595 A1 | 7/2005 | Kondo et al. | |
| 2006/0243982 A1 | 11/2006 | Chang et al. | |
| 2007/0296304 A1 | 12/2007 | Fujii et al. | |
| 2007/0296306 A1 | 12/2007 | Hauser et al. | |
| 2009/0189483 A1 | 7/2009 | Kadota et al. | |
| 2012/0231218 A1 | 9/2012 | Nakayama et al. | |
| 2013/0026881 A1 | 1/2013 | Okamoto et al. | |
| 2015/0325775 A1 | 11/2015 | Shimizu | |
| 2017/0279435 A1 | 9/2017 | Geshi et al. | |
| 2017/0296306 A1 | 10/2017 | Edgren | |
| 2017/0353173 A1 | 12/2017 | Sakurai et al. | |
| 2018/0034439 A1 | 2/2018 | Ruby et al. | |
| 2018/0102760 A1 | 4/2018 | Inoue et al. | |
| 2018/0109241 A1 | 4/2018 | Inoue et al. | |
| 2018/0175275 A1 | 6/2018 | Nishihara et al. | |
| 2019/0068161 A1 | 2/2019 | Kimura | |
| 2019/0074819 A1 | 3/2019 | Goto et al. | |
| 2019/0123713 A1 | 4/2019 | Daimon | |
| 2019/0260563 A1 | 8/2019 | Yang | |
| 2019/0296713 A1 | 9/2019 | Bhattacharjee | |
| 2019/0326878 A1 | 10/2019 | Kakita et al. | |
| 2019/0379347 A1 | 12/2019 | Goto et al. | |
| 2019/0379348 A1 | 12/2019 | Tang et al. | |
| 2020/0091891 A1 | 3/2020 | Geshi et al. | |
| 2020/0106420 A1 | 4/2020 | Kodama et al. | |
| 2020/0119710 A1 | 4/2020 | Kadota et al. | |
| 2020/0119711 A1 | 4/2020 | Kadota et al. | |
| 2020/0162053 A1 | 5/2020 | Goto et al. | |
| 2020/0212878 A1 | 7/2020 | Shin et al. | |
| 2020/0212882 A1 | 7/2020 | Shin et al. | |
| 2020/0212884 A1 | 7/2020 | Shin et al. | |
| 2020/0212891 A1 | 7/2020 | Daimon | |
| 2020/0274513 A1 | 8/2020 | Fukuhara et al. | |
| 2020/0274517 A1 | 8/2020 | Fukuhara et al. | |
| 2021/0067131 A1 | 3/2021 | Tang et al. | |
| 2021/0075389 A1 | 3/2021 | Belhachemi et al. | |
| 2021/0159883 A1 | 5/2021 | Kadota et al. | |
| 2022/0123712 A1 | 4/2022 | Tang et al. | |
| 2022/0200566 A1 | 6/2022 | Kadota et al. | |
| 2022/0368311 A1 | 11/2022 | Shin et al. | |
| 2024/0356519 A1 | 10/2024 | Goto et al. | |

FOREIGN PATENT DOCUMENTS

| | | |
|---|---|---|
| JP | 2006-180334 | 7/2006 |
| JP | 4186300 | 11/2008 |
| JP | 2009-094661 | 4/2009 |
| JP | 2011-066818 | 3/2011 |
| JP | 2017-022501 | 1/2017 |
| JP | 2016-100744 | 3/2019 |
| RU | 2336372 | 10/2007 |

OTHER PUBLICATIONS

Geshi et al., "Wafer Bonding of Polycrystalline Spinel with LiNbO$_3$/LiTaO$_3$ for Temperature Compensation of RF Surface Acoustic Wave Devices", SEI Technical Review, No. 75, pp. 116-119, Oct. 2012.

Linseis, "LFA 1000-Aluminum Oxide Al2)3-Thermal diffusivity/conductivity", 2000.

Petit et al., "Processing of highly transparent spinel ceramics for high thermo-mechanical resistance window applications", Advanced Solid-State Lasers Congress Technical Digest, OSA 2013.

Sarabalis et al., "Acousto-optic modulation in lithium niobate on sapphire", published online Aug. 12, 2020, in APL Photonics.

Shim et al., "RF MEMS Passives on High-Resistivity Silicon Substrates", IEEE Microwave and Wireless Components Letters, 2013.

* cited by examiner

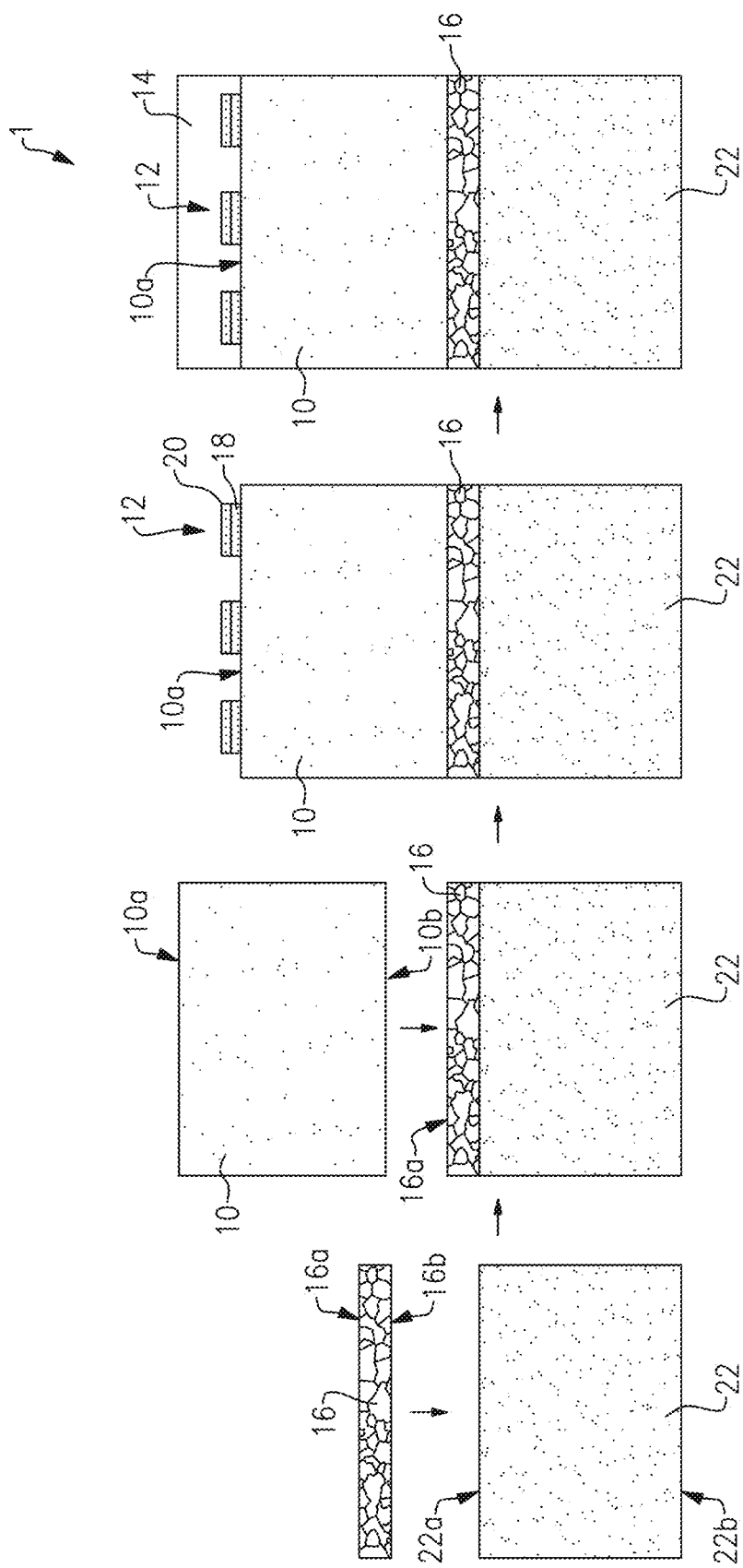

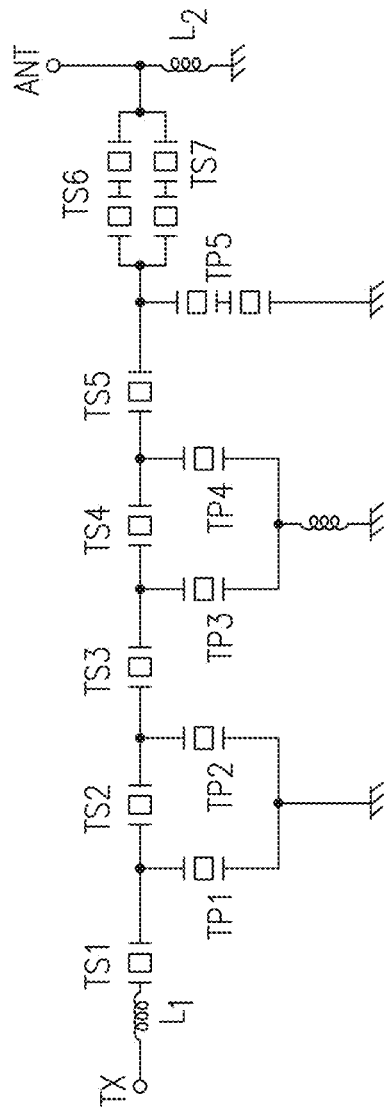
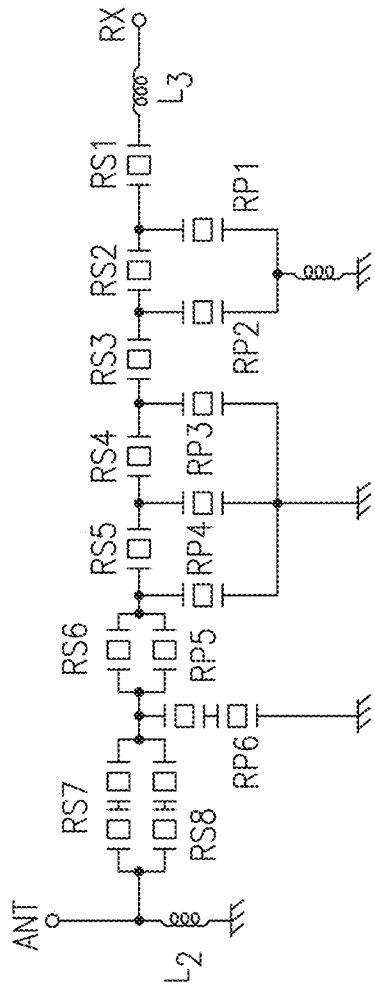
FIG.8A
FIG.8B

ACOUSTIC WAVE DEVICE WITH MULTI-LAYER SUBSTRATE INCLUDING CERAMIC

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Technical Field

Embodiments of this disclosure relate to acoustic wave devices.

Description of Related Technology

Acoustic wave filters can be implemented in radio frequency electronic systems. For instance, filters in a radio frequency front end of a mobile phone can include acoustic wave filters. An acoustic wave filter can filter a radio frequency signal. An acoustic wave filter can be a band pass filter. A plurality of acoustic wave filters can be arranged as a multiplexer. For example, two acoustic wave filters can be arranged as a duplexer.

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transducer electrode on a piezoelectric substrate. The surface acoustic wave resonator can generate a surface acoustic wave on a surface of the piezoelectric layer on which the interdigital transductor electrode is disposed.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

In one aspect, an acoustic wave device is disclosed. The acoustic wave device can include a support substrate, a ceramic layer positioned over the support substrate, a piezoelectric layer positioned over the ceramic layer, and an interdigital transducer electrode positioned over the piezoelectric layer. The support substrate has a higher thermal conductivity than the ceramic layer. The acoustic wave device configured to generate an acoustic wave.

In an embodiment, the support substrate is a single crystal layer.

In an embodiment, the support substrate includes silicon.

In an embodiment, the acoustic wave has a wavelength of λ, and the piezoelectric layer has a thickness in a range from 3λ to 40λ.

In an embodiment, the acoustic wave has a wavelength of λ, and a thickness of the piezoelectric layer is at least 5λ.

In an embodiment, the ceramic layer includes polycrystalline spinel.

In an embodiment, a surface of the ceramic layer has a maximum surface roughness of 2 nanometers or less.

In an embodiment, the surface of the ceramic layer has a surface roughness in a range from 0.1 nanometers to 2 nanometers. The ceramic layer and the piezoelectric layer can be directly bonded to each other without an intervening layer.

In an embodiment, a surface of the ceramic layer has an average surface roughness of 1 nanometers or less.

In an embodiment, the ceramic layer and the support substrate are bonded to each other by way of an adhesive. The adhesive can include at least one of aluminum, titanium, or a nitride.

In an embodiment, the acoustic wave device further includes a temperature compensation layer over the interdigital transducer electrode.

In an embodiment, the interdigital transducer electrode includes two layers. One of the two layers can include aluminum. The other of the two layers can include molybdenum.

In an embodiment, the piezoelectric layer includes lithium based piezoelectric layer.

In an embodiment, the ceramic layer is arranged to scatter back reflections of the acoustic wave.

In an embodiment, the support substrate is thicker than the ceramic layer.

In an embodiment, a surface acoustic wave filter includes the surface acoustic wave resonators that is arranged to filter a radio frequency signal. A front end module can include the surface acoustic wave filter, other circuitry, and a package that encloses the surface acoustic wave filter and the other circuitry. The other circuitry can include a multi-throw radio frequency switch. The other circuitry can include a power amplifier. A wireless communication device can include an antenna and the surface acoustic wave filter. The surface acoustic wave filter can be arranged to filter a radio frequency signal associated with the antenna.

In one aspect, an acoustic wave device is disclosed. The acoustic wave device can include a support substrate, a polycrystalline spinel layer positioned over the support substrate, a piezoelectric layer positioned over the polycrystalline spinel layer, and an interdigital transducer electrode positioned over the piezoelectric layer. The support substrate has a greater thermal conductivity than the polycrystalline spinel layer. The acoustic wave resonator is configured to generate an acoustic wave.

In an embodiment, the acoustic wave device further includes a temperature compensation layer positioned over the interdigital transducer electrode. The temperature compensation layer can be a silicon dioxide layer.

In an embodiment, the support substrate is monocrystalline.

In an embodiment, the support substrate includes silicon.

In an embodiment, the support substrate includes sapphire.

In an embodiment, the support substrate is thicker than the polycrystalline spinel layer.

In an embodiment, a surface of the polycrystalline spinel layer has a maximum roughness of 2 nanometers or less.

In an embodiment, the surface of the polycrystalline spinel layer has a surface roughness in a range from 0.1 nanometers to 2 nanometers. The polycrystalline spinel layer and the piezoelectric layer can be bonded to each other without an intervening layer.

In an embodiment, a surface of the support substrate has an average roughness of 2 nanometers or less. The polycrystalline spinel layer and the support substrate can be bonded to each other without an intervening adhesive.

In an embodiment, the acoustic wave device further includes an adhesive layer between the polycrystalline spinel layer and the support substrate. The adhesive layer can include at least one of aluminum, titanium, or a nitride. The adhesive layer can have a greater thermal conductivity than the polycrystalline spinel layer.

In an embodiment, the acoustic wave has a wavelength of λ, and the piezoelectric layer has a thickness in a range from 3λ to 40λ.

In an embodiment, the surface acoustic wave has a wavelength of λ, and a thickness of the piezoelectric layer is at least 5λ.

In an embodiment, the interdigital transducer electrode includes two layers. One of the two layers can include aluminum. The other of the two layers can include molybdenum.

In an embodiment, the piezoelectric layer includes lithium niobate.

In an embodiment, a surface acoustic wave filter includes surface acoustic wave resonators arranged to filter a radio frequency signal. The surface acoustic wave resonators including the surface acoustic wave resonator. A front end module can include the surface acoustic wave filter, other circuitry, and a package that encloses the surface acoustic wave filter and the other circuitry. The other circuitry cab include a multi-throw radio frequency switch. The other circuitry can include a power amplifier. A wireless communication device comprising an antenna and the surface acoustic wave filter. The surface acoustic wave filter can be arranged to filter a radio frequency signal associated with the antenna.

In one aspect, a surface acoustic wave filter is disclosed. The surface acoustic wave filter can include a surface acoustic wave resonator. The surface acoustic wave resonator can include a support substrate, a ceramic layer positioned over the support substrate, a piezoelectric layer positioned over the ceramic layer, and an interdigital transducer electrode positioned over the piezoelectric layer. the surface acoustic wave filter can also include a plurality of other surface acoustic wave resonators. The surface acoustic wave resonator and the plurality of other surface acoustic wave resonators are together arranged to filter a radio frequency signal.

In an embodiment, the ceramic layer is a polycrystalline spinel layer.

In an embodiment, a front end module includes the surface acoustic wave filter, other circuitry, and a package that encloses the surface acoustic wave filter and the other circuitry. The other circuitry can include a multi-throw radio frequency switch. The other circuitry includes a power amplifier.

In an embodiment, a wireless communication device comprising an antenna and the surface acoustic wave filter. The surface acoustic wave filter can be arranged to filter a radio frequency signal associated with the antenna.

In one aspect, a method of manufacturing an acoustic wave device is disclosed. The method can include attaching a support substrate to a ceramic layer. The support substrate has a higher thermal conductivity than the ceramic layer. The method can also include bonding a piezoelectric layer to a surface of the ceramic layer such that the piezoelectric layer and the support substrate are on opposing sides of the ceramic layer. The method can further include forming an interdigital transducer electrode over the piezoelectric layer. The acoustic wave device includes the support substrate, the ceramic layer, the piezoelectric layer, and the interdigital transducer electrode.

In an embodiment, the support substrate includes silicon.

In an embodiment, the method further includes smoothing the surface of the ceramic layer prior to the bonding. The surface of the ceramic layer can have a maximum surface roughness of 2 nanometers or less after the smoothing. The surface of the ceramic layer can have an average surface roughness of 1 nanometer or less. The smoothing can include chemical-mechanical polishing.

In an embodiment, the method further includes smoothing a surface of the support substrate prior to the attaching.

In an embodiment, the method further includes smoothing a second surface of the ceramic layer prior to the attaching. The second surface of the ceramic layer is opposite to the surface of the ceramic layer.

In an embodiment, the attaching includes applying an adhesive between the support substrate and the ceramic layer.

In an embodiment, the attaching the support substrate to the ceramic layer includes direct bonding.

In an embodiment, the bonding the piezoelectric layer and the ceramic layer includes direct bonding.

In an embodiment, the acoustic wave device is a surface acoustic wave resonator of a surface acoustic wave filter.

In one aspect, a method of manufacturing an acoustic wave device is disclosed. The method can include attaching a support substrate to a polycrystalline spinel layer. The support substrate has a higher thermal conductivity than the polycrystalline spinel layer. The method can also include bonding a piezoelectric layer to a surface of the polycrystalline spinel layer such that the piezoelectric layer and the support substrate are on opposing sides of the polycrystalline spinel layer. The method can further include forming an interdigital transducer electrode over the piezoelectric layer.

In an embodiment, the method further includes smoothing the surface of the polycrystalline spinel layer prior to the bonding. The surface of the polycrystalline spinel can have a surface roughness in a range from 0.1 to 2 nanometers after the smoothing. The surface of the polycrystalline layer can have an average surface roughness of 1 nanometer or less. The surface of the polycrystalline layer can have a surface roughness in a range from 0.1 nanometers to 2 nanometers. The smoothing can include chemical-mechanical polishing.

In an embodiment, the method further includes smoothing a surface of the support substrate prior to the attaching.

In an embodiment, the method further includes smoothing a second surface the polycrystalline spinel layer prior to the attaching. The second surface of the polycrystalline spinel layer is opposite to the surface of the polycrystalline spinel layer.

In an embodiment, the attaching includes applying an adhesive between the support substrate and the polycrystalline spinel layer.

In an embodiment, the attaching the support substrate to the polycrystalline spinel layer includes direct bonding.

In an embodiment, the bonding the piezoelectric layer and the polycrystalline spinel layer includes direct bonding.

In an embodiment, the method further includes forming a temperature compensation layer over the interdigital transducer electrode.

In one aspect, a method of manufacturing a surface acoustic wave filter for filtering a radio frequency signal is disclosed. The method can include attaching a support substrate to a ceramic layer. The support layer has a higher thermal conductivity than the ceramic layer. The method can also include bonding a piezoelectric layer to a surface of the ceramic layer. The method can also include forming an interdigital transducer electrode over the piezoelectric layer.

A surface acoustic wave resonator includes the interdigital transducer electrode. The method can further include electrically connecting the surface acoustic wave resonator to another surface acoustic wave resonator of the surface acoustic wave filter.

In an embodiment, the ceramic layer is a polycrystalline spinel layer.

The present disclosure relates to U.S. patent application Ser. No. 16/800,391, titled "METHOD OF MANUFACTURING ACOUSTIC WAVE DEVICE WITH MULTILAYER SUBSTRATE INCLUDING CERAMIC," filed on Feb. 25, 2020, the entire disclosure of which is hereby incorporated by reference herein.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

FIG. 7A illustrates a cross section of a SAW resonator at a step in a manufacturing process, according to embodiment.

FIG. 7B illustrates a cross sections of a SAW resonator at another step in the manufacturing process.

FIG. 7C illustrates a cross sections of a SAW resonator at another step in the manufacturing process.

FIG. 7D illustrates a cross sections of a SAW resonator at another step in the manufacturing process.

FIG. 8A is a schematic diagram of a transmit filter that includes a surface acoustic wave resonator according to an embodiment.

FIG. 8B is a schematic diagram of a receive filter that includes a surface acoustic wave resonator according to an embodiment.

DETAILED DESCRIPTION OF CERTAIN EMBODIMENTS

Figure 1:
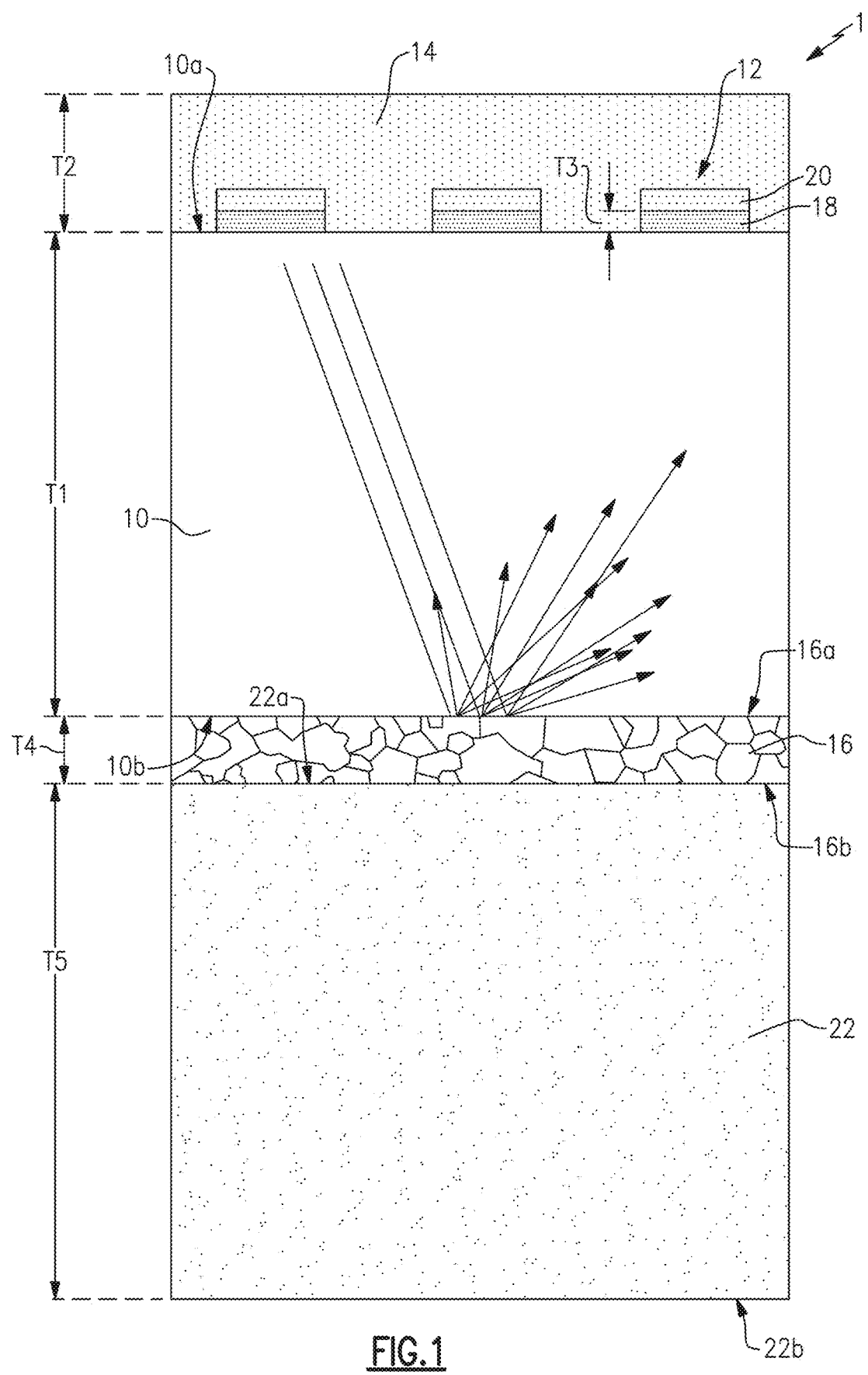
FIG. 1 illustrates a cross section of a surface acoustic wave (SAW) resonator that includes a polycrystalline spinel layer according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) devices.

SAW devices include SAW resonators, SAW delay lines, and multi-mode SAW (MMS) filters (e.g., double mode SAW (DMS) filters).

Acoustic wave filters can include SAW resonators that include a multi-layer piezoelectric substrate. Multi-layer piezoelectric substrates can provide good thermal dissipation characteristics and improved temperature coefficient of frequency (TCF) relative to certain single layer piezoelectric substrates. For example, a SAW device with a piezoelectric layer on a high impedance support substrate, such as silicon, can achieve better temperature coefficient of frequency (TCF) and thermal dissipation compared to a similar device without the high impedance support substrate.

For example, a SAW device can include a temperature compensation layer (e.g., a silicon dioxide ($SiO_2$) layer), a piezoelectric layer (e.g., a lithium niobate (LN) layer), an interdigital transducer (IDT) electrode over the piezoelectric layer, and a high impedance support substrate (e.g., a silicon substrate) under the piezoelectric layer. Such devices with the high impedance substrate under the piezoelectric layer can obtain a better TCF and/or a better thermal dissipation characteristic than temperature compensated (TC) SAW devices that do not include the high impedance substrate structure in certain applications. However, SAW devices that include a piezoelectric layer on certain high impedance support substrates can experience spurious responses as a result of back reflection from the high impedance support substrate. This can degrade a frequency response of a filter that includes the SAW devices.

In order to reduce and/or mitigate this degradation of the SAW device performance, SAW devices can include a ceramic substrate, such as a polycrystalline spinel support substrate. A polycrystalline spinel support substrate can be a magnesium aluminate ($MgAl_2O_4$) spinel substrate. A polycrystalline spinel support substrate can scatter back reflections by a beam scattering feature of the polycrystalline spinel substrate. The polycrystalline spinel substrate can have desirable flatness characteristics. At least because the polycrystalline spinel substrate can have a desirable flatness, the polycrystalline spinel substrate can be directly bonded to a piezoelectric layer without an intervening adhesive. Such direct bonding can be a relatively easy manufacturing operation. The polycrystalline spinel substrate can also achieve advantages of other high impedance support substrates, such as improved TCF and/or desirable thermal dissipation. However, a polycrystalline spinel substrate has a relatively low heat conductivity. Hence, the SAW device with a polycrystalline spinel substrate may generate a relatively high temperature, which can degrade the performance of the SAW device.

Aspects of the present disclosure relate to SAW devices that include a supporting substrate (e.g., a single crystal layer), a ceramic layer (e.g., a spinel layer, such as a polycrystalline spinel layer) over the supporting substrate, a piezoelectric layer (e.g., a lithium niobate (LN) layer) over the ceramic layer, an interdigital transducer (IDT) electrode over the piezoelectric layer. Such SAW devices can also include a temperature compensation layer (e.g., silicon dioxide (SiO2) layer) over the IDT electrode in certain embodiments. The SAW devices can also include an adhesive layer disposed between the supporting substrate and the spinel layer in some applications.

SAW devices disclosed herein that include a polycrystalline spinel layer and a support substrate can achieve desirable suppression of backscattering and desirable heat dissipation. For example, temperature simulations indicate that chip temperature is decreased in a SAW resonator with a polycrystalline spinel layer on a silicon support substrate compared with a similar SAW resonator with polycrystalline spinel as the base substrate. The polycrystalline spinel can also scatter elastic waves to suppress reflection of such elastic waves.

Although embodiments may be discussed with reference to SAW resonators, any suitable principles and advantages discussed herein can be applied to any suitable SAW device and/or any other suitable acoustic wave device. Embodiments will now be discussed with reference to drawings. Any suitable combination of features of the embodiments disclosed herein can be implemented together with each other.

Figure 2A:
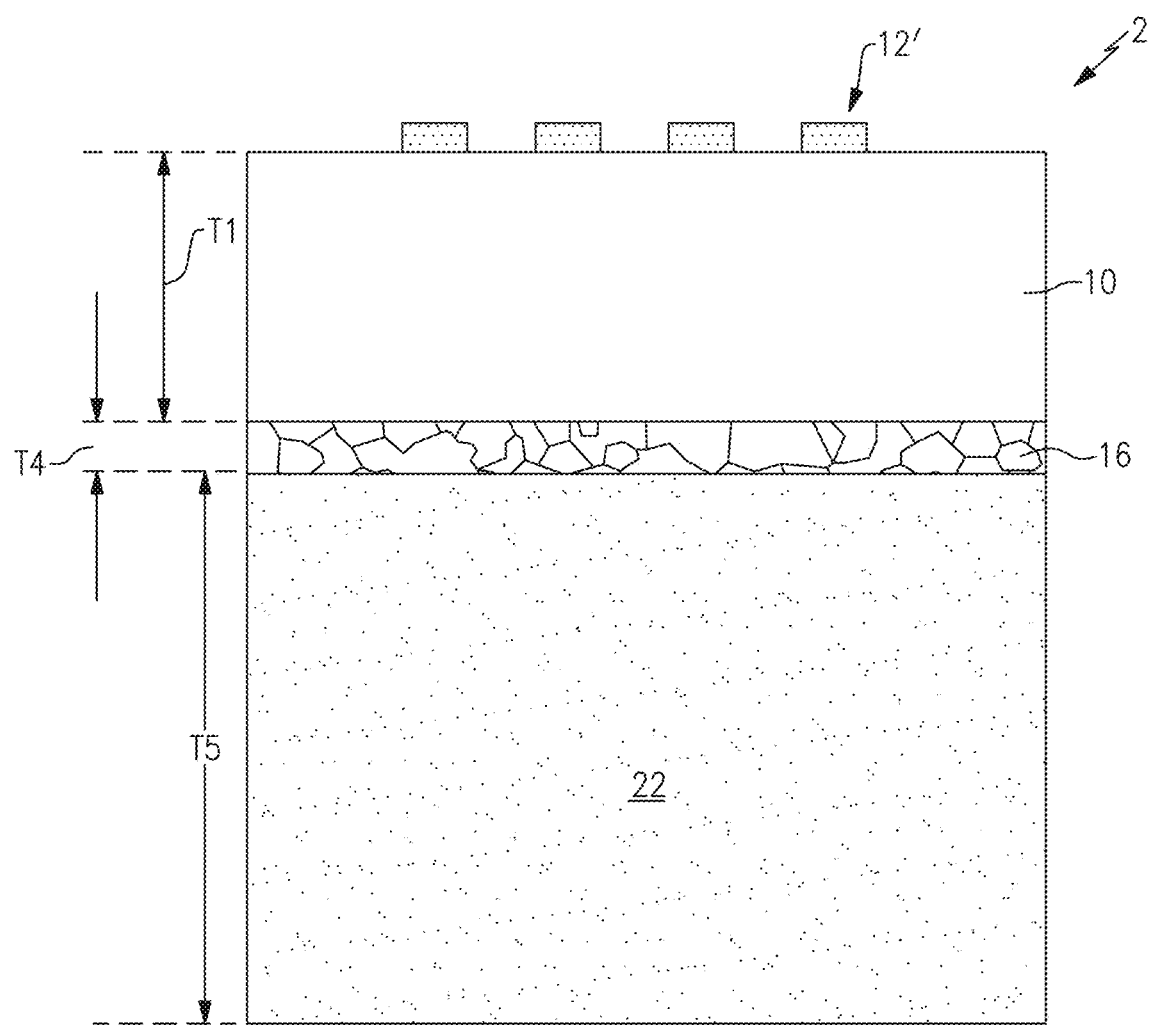
FIG. 2A illustrates a cross section of a surface acoustic wave resonator that includes a polycrystalline spinel layer according to another embodiment.
Figure 5:
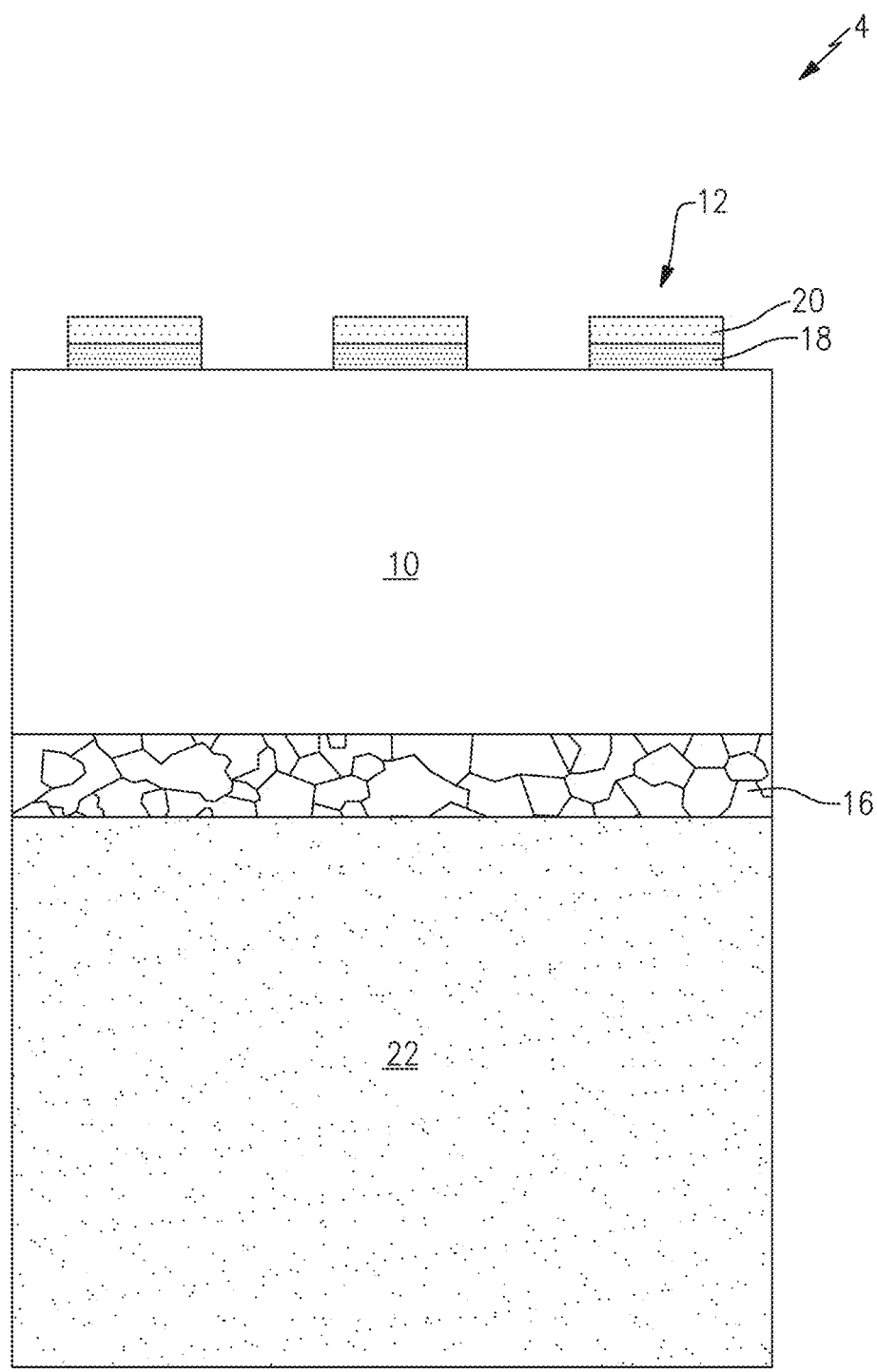
FIG. 5 illustrates a cross section of a surface acoustic wave resonator according to another embodiment.

FIG. 1 illustrates a cross section of a surface acoustic wave (SAW) resonator 1 according to an embodiment. The illustrated SAW resonator 1 includes a piezoelectric layer 10, an IDT electrode 12 over the piezoelectric layer 10, a temperature compensation layer 14 over the IDT electrode 12, a ceramic layer (e.g., a polycrystalline spinel substrate 16) below the piezoelectric layer 10, and a support substrate 22 below the polycrystalline substrate 16. The piezoelectric layer 10 can be any suitable piezoelectric layer. In some embodiments, the piezoelectric layer 10 can be a lithium based piezoelectric, such as a lithium niobate (LN) layer or a lithium tantalate (LT) layer. The temperature compensation layer 14 may include any suitable temperature compensation material that has a positive temperature coefficient of frequency. For instance, the temperature compensation layer 14 can be a silicon dioxide ($SiO_2$) layer, a tellurium dioxide ($TeO_2$) layer or a silicon oxyfluoride (SiOF) layer in certain applications. A temperature compensation layer can include any suitable combination of $SiO_2$, $TeO_2$, and/or SiOF. In some embodiments, for example, as illustrated in FIGS. 2A and 5, the temperature compensation layer 14 of FIG. 1 may be omitted.

The polycrystalline spinel substrate 16 can be a magnesium aluminate ($MgAl_2O_4$) spinel substrate. The polycrystalline spinel substrate 16 can be replaced with any suitable ceramic substrate. A ceramic substrate can include, for example, polycrystalline spinel (e.g., $MgAl_2O_4$), co-fired ceramic, or polycrystalline aluminum nitride (AlN). The ceramic substrate can have higher acoustic impedance than an acoustic impedance of the piezoelectric layer 10. The ceramic layer can be arranged to scatter back reflections of an acoustic wave generated by the SAW resonator 1.

Ceramics, such as polycrystalline spinel, are better wave scattering materials than various single crystals. Accordingly, a ceramic substrate, such as the polycrystalline spinel substrate 16, can scatter waves at a diffraction boundary between the polycrystalline spinel layer 16 and the piezoelectric layer 10 of the surface acoustic wave device 1. With the back scattering of the polycrystalline spinel layer 16, spurious modes resulting from back scattering can be suppressed. This can avoid and/or mitigate degradation of a frequency response of a filter that includes the SAW resonator 1.

The polycrystalline spinel substrate 16 can have desirable flatness at the diffraction boundary between the polycrystalline spinel layer 16 and the piezoelectric layer 10 (e.g., an upper surface 16a of the polycrystalline spinel layer 16). The polycrystalline spinel substrate 16 can achieve desirable diffraction while being relatively smooth. For instance, the polycrystalline spinel layer 16 can have a smoothness in a range from about 0.1 nanometer (nm) to 2 nm. This is unlike some other high impedance support substrates that can create spurious responses as a result of back reflection when they are relatively smooth. The polycrystalline spinel layer 16 can be bonded to the piezoelectric layer 10. The polycrystalline spinel substrate 16 can be directly bonded to the piezoelectric layer 10 without an intervening adhesive. There can be little or no delamination of the polycrystalline spinel layer 16 and the piezoelectric layer 10 after bonding.

The polycrystalline spinel layer 16 has a thickness T4. The thickness T4 of the polycrystalline spinel layer 16 can be any suitable thickness. The thickness T4 of the polycrystalline spinel layer 16 can be sufficiently thick to maintain structural integrity of a surface acoustic wave device. The thickness T4 can be determined in accordance with principles and advantages explained with respect to FIG. 3.

The support substrate 22 has a greater heat conductivity than the polycrystalline spinel layer 16. For example, the support substrate 22 can have a thermal conductivity that is at least 9 times the thermal conductivity of the polycrystalline spinel layer 16. The surface acoustic wave resonator 1 with the support substrate 22 that has a greater thermal conductivity than the polycrystalline spinel layer 16 can be more durable than a similar surface acoustic wave resonator with a support substrate that does not have a greater thermal conductivity than a polycrystalline spinel layer.

The support substrate 22 can be a single crystal layer. The support substrate 22 can include, for example, silicon (Si), sapphire, aluminum oxide ($Al_2O_3$), aluminum nitride (AlN), quartz, glass with a relatively high thermal conductivity, etc. In certain embodiments, the support substrate 22 is a silicon substrate. The support substrate 22 has a lower line expansion than the polycrystalline spinel layer 16 in certain applications. In such applications, temperature coefficient of frequency (TCF) may be improved. In certain embodiments, the support substrate 22 has a lower permittivity than the polycrystalline spinel layer 16. In such embodiments, the support substrate 22 may be highly isolated.

The support substrate 22 has a thickness T5. The thickness T5 of the support substrate 22 can be any suitable thickness. In some embodiments, the thickness T5 of the support substrate 22 can be greater than the thickness T4 of the polycrystalline spinel layer 16. The thickness T5 can be determined, for example, as explained with respect to FIG. 3.

The IDT electrode 12 illustrated in FIG. 1 includes a plurality of metal layers. The IDT electrode 12 can include a molybdenum (Mo) layer 18 and an aluminum (Al) layer 20. The IDT electrode 12 may include other metals, such as, copper (Cu), Magnesium (Mg), titanium (Ti), tungsten (W), etc. The IDT electrode 12 may include alloys, such as AlMgCu, AlCu, etc. The polycrystalline spinel layer 16 can reduce the back reflection compared to other support substrates, such as a silicon substrate, a sapphire substrate, or the like.

The Mo layer 18 of the IDT electrode 12 has a thickness T3. In some embodiments, the thickness T3 of the Mo layer 18 can be about 0.05 L. For example, when the wavelength L is 4 micrometers (μm), the thickness T3 of the Mo layer 18 can be 200 nm in such embodiments.

The piezoelectric layer 10 has a thickness T1. The thickness T1 of the piezoelectric layer 10 can be selected based on a wavelength λ or L of a surface acoustic wave generated by the surface acoustic wave resonator 1. The IDT electrode 12 has a pitch that sets the wavelength λ or L of the surface acoustic wave device 1. The piezoelectric layer 10 can be sufficiently thick to avoid significant frequency variation. A thickness T1 of the piezoelectric layer 10 of at least 3 L can be sufficiently thick to mitigation frequency variation due to a relatively thin piezoelectric layer 10. The thickness T1 of the piezoelectric layer 10 can be in a range from, for example, 3 L to 40 L. As another example, the thickness T1 of the piezoelectric layer 10 can be in a range from 3 L to 20 L. In some instances, the thickness T1 of the piezoelectric layer 10 can be at least 5 L, such as in a range from 5 L to 40 L. The wavelength L of the surface acoustic wave can be, for example, 4 μm and the thickness T1 of the piezoelectric layer 10 can be, for example, 20 μm, in some embodiments. As noted above, the piezoelectric layer 10 may include any suitable piezoelectric layer, such as a lithium niobate (LN) layer or a lithium tantalate (LT) layer.

The temperature compensation layer 14 can bring the TCF of the surface acoustic wave resonator 1 closer to zero to thereby provide temperature compensation. The temperature compensation layer 14 can improve the electromechanical coupling coefficient $k^2$ of the SAW resonator 1 relative to a similar SAW resonator without the temperature compensation layer 14. This advantage of the temperature compensation layer 14 can be more pronounced when the piezoelectric layer 10 is an LN layer. The temperature compensation layer 14 has a thickness T2. In some embodiments, the thickness T2 of the temperature compensation layer 14 can be in a range from 0.1 L to 0.5 L. For example, when the wavelength L is 4 μm, the thickness T2 of the temperature compensation layer 14 can be 1200 nm.

In some embodiments, the thickness T1 of the piezoelectric layer 10 may be adjusted by grinding from an upper surface 10a of the piezoelectric layer 10 after bonding a lower surface 10b of the piezoelectric layer 10 and an upper surface 16a the polycrystalline spinel layer 16. The piezoelectric layer 10 and the polycrystalline spinel layer 16 can be directly bonded without an intervening adhesive. The lower surface 10b of the piezoelectric layer 10 and the upper surface 16a the polycrystalline spinel layer 16 can be subjected to an appropriate preparation for such direct bonding. The preparation of the surfaces 10b and 16a can include smoothing the surfaces 10b and/or 16a, for example, as discussed with reference to FIG. 6. The temperature compensation layer 14 can be formed over the upper surface 10a of the piezoelectric layer 10.

FIG. 2A illustrates a cross section of a surface acoustic wave resonator 2 that includes a polycrystalline spinel layer 16 according to another embodiment. The illustrated SAW resonator 2 includes a piezoelectric layer 10, IDT electrode 12' over the piezoelectric layer 10, a ceramic layer (e.g., a polycrystalline spinel layer 16), and a support substrate 22. Unless otherwise noted, elements shown in FIG. 2A may be the same as or generally similar to like numbered elements in FIG. 1. The surface acoustic wave resonator 2 is like the surface acoustic wave resonator 1 of FIG. 1. However, unlike that the SAW resonator 1 illustrated in FIG. 1, the SAW resonator 2 does not include the temperature compensation layer 14. The back scattering of the polycrystalline spinel layer 16 may be unaffected by the absence of the temperature compensation layer 14 of the SAW resonator 1 illustrated in FIG. 1. Also, the IDT electrode 12' illustrated in FIG. 2A is a single layer IDT. In some other embodiments, a multi-layer IDT (e.g., the IDT electrode 12 illustrated in FIG. 1) that include two or more layers can be used.

Figure 2B:
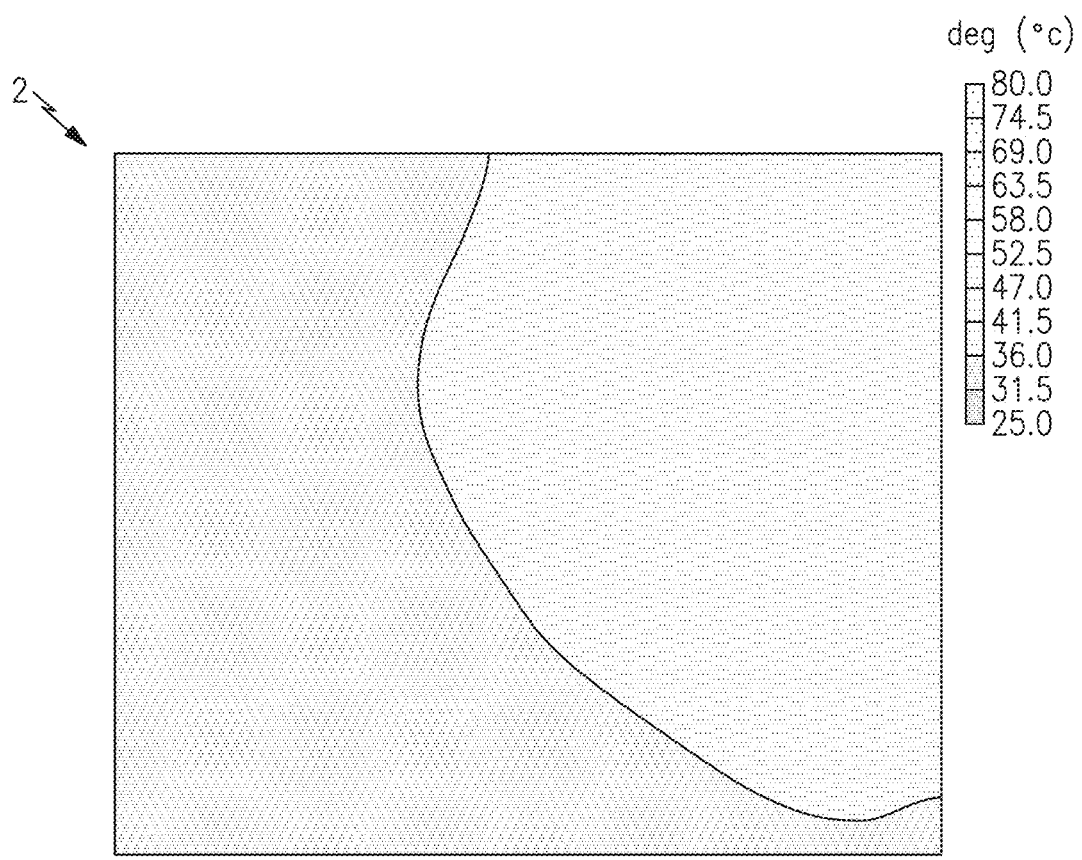
FIG. 2B is a thermal map of a SAW chip that includes a SAW resonator of FIG. 2A.

FIG. 2B is a simulated heat map of a SAW chip that includes the SAW resonator 2 of FIG. 2A. For this simulation, a lithium niobate (LN) layer is used for the piezoelectric layer 10, and a silicon (Si) substrate is used for the support substrate 22. The SAW resonator used in the thermal simulation has a thickness T1 of the piezoelectric layer of 20 μm, a thickness T4 of the polycrystalline spinel layer of 20 μm, and a thickness T5 of a silicon support substrate of 120 μm. From the thermal simulation result of the SAW chip that includes the SAW resonator, as seen from the top of the simulated heat map, higher temperature is indicated towards the right hand side on FIG. 2B compared to the left hand side. The maximum chip temperature observed from the thermal simulation is 39° C. This is a relatively low temperature as the maximum temperature for a SAW chip. The maximum SAW chip temperature with SAW resonators 2 of FIG. 2A was simulated to be more than 10° C. lower that a similar SAW chip with resonators that included a polycrystalline base substrate without a silicon support substrate. This reduction in maximum SAW chip temperature can be due to the thermal conductivity of the support substrate 22. Therefore, the SAW resonator 2 can provide a good heat dissipation. Such heat dissipation can be achieved while also suppressing spurious modes resulting from back scattering.

Figure 3:
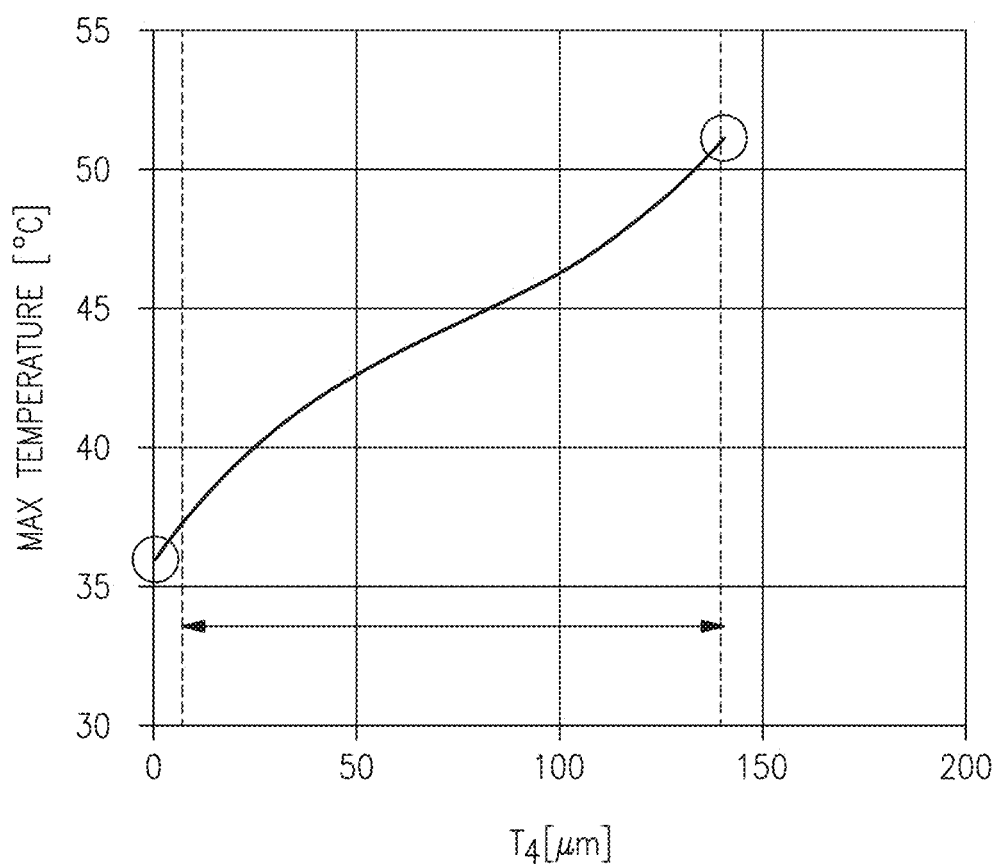
FIG. 3 is a graph of a thermal simulation result of a SAW resonator.

FIG. 3 is a graph of a thermal simulation result of the SAW resonator 2 used in the simulation of FIG. 2B for varying thicknesses of the polycrystalline spinel layer 16. The total thickness of the polycrystalline spinel layer 16 and the support substrate 22 (T4+T5) is set to be 140 μm. The x-axis shows the thickness T4 of the polycrystalline spinel layer 16 ranging from 0 to 140 μm, and the y-axis shows the maximum temperature of the SAW resonator 2 in operation. Therefore, when the thickness T4 of the polycrystalline spinel layer 16 is, for example, 50 μm, the thickness T5 of the support substrate 22 is 90 μm, and the maximum temperature for the simulated embodiment of the SAW resonator 2 is about 42.5° C.

The lower end of the range of thickness T4 of the polycrystalline spinel layer 16 can be determined based at least in part on back reflection suppression properties of the polycrystalline spinel layer 16. For example, the thickness T4 can be at least about 1 L, or 4 μm when the wavelength L is 4 μm. At a thickness T4 of about 1 L, the polycrystalline spinel layer 16 can provide sufficient backscattering for performance of a SAW resonator in certain applications. The upper end of the thickness T4 of the polycrystalline spinel layer 16 can be determined based at least in part on the maximum device thickness (140 μm in this case), and/or the desired maximum temperature of the SAW chip. For example, if a maximum desired temperate of a SAW chip is 45° C., the thickness T4 of the polycrystalline spinel layer 16 can be selected to be less than about 80 μm based on FIG. 3.

In certain applications, a range of the thickness T4 of the polycrystalline spinel layer 16 can be chosen based at least in part on an inflection point observed within the range between the lower end and the upper end of the thickness T4. For example, on the curve shown in the graph in FIG. 3, there is an inflection point at around T4=75 μm. Therefore, the thickness T4 of the polycrystalline spinel layer 16 can be selected to be in a range from 1 L to about 75 μm in certain embodiments.

Figure 4:
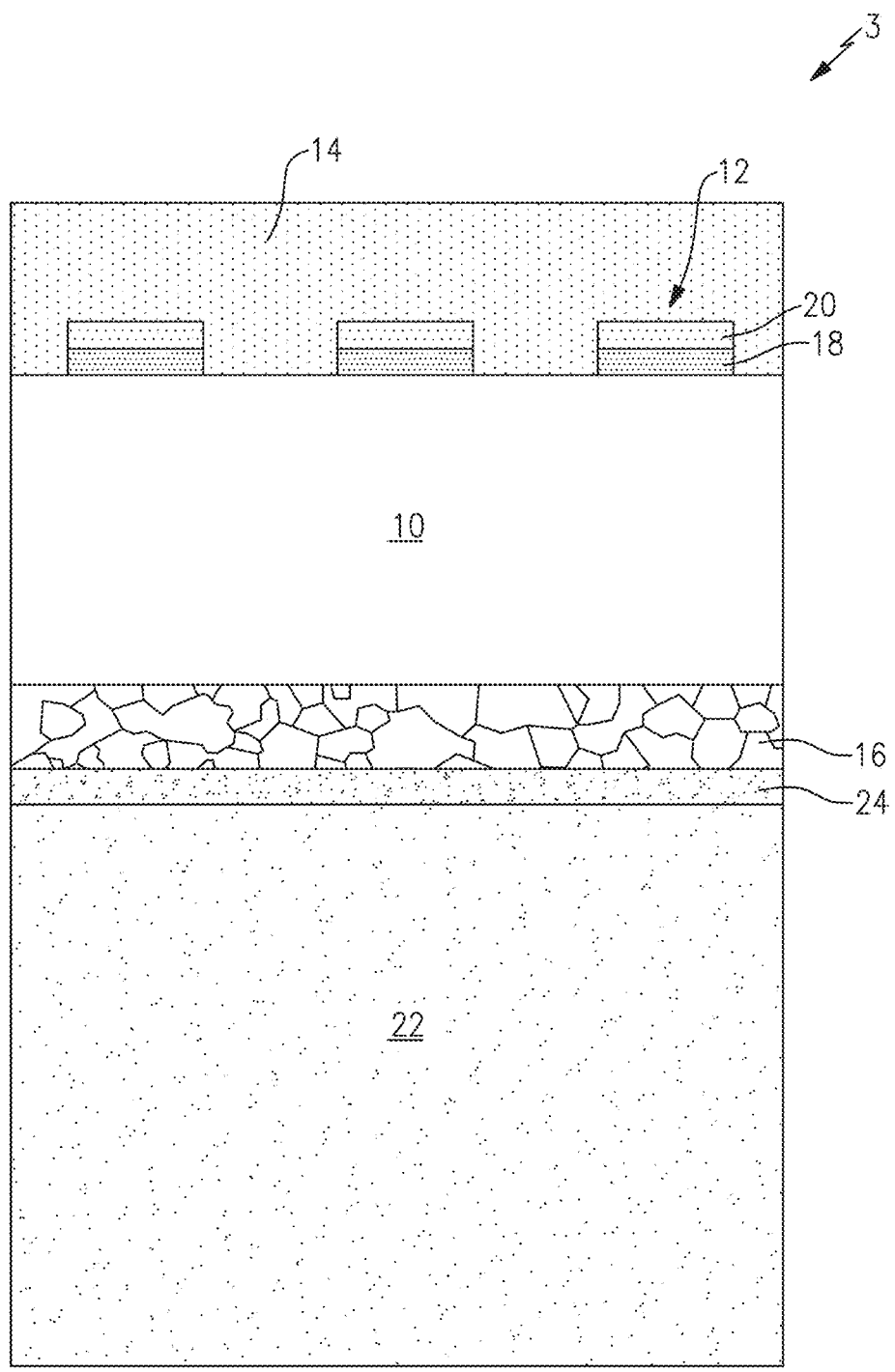
FIG. 4 illustrates a cross section of a surface acoustic wave resonator according to an embodiment.

FIG. 4 illustrates a cross section of a surface acoustic wave resonator 3 according to an embodiment. The illustrated SAW resonator 3 includes a piezoelectric layer 10 (e.g., a lithium niobate (LN) layer, a lithium tantalate (LT) layer, etc.), an IDT electrode 12 over the piezoelectric layer 10, a temperature compensation layer 14 over the IDT electrode 12, a ceramic layer (e.g., a polycrystalline spinel layer 16) below the piezoelectric layer 10, a support substrate 22 below the polycrystalline substrate 16, and an adhesive layer 24 between the polycrystalline spinel layer 16 and the support substrate 22. Unless otherwise noted, elements shown in FIG. 4 may be the same as or generally similar to like numbered elements in FIGS. 1 and 2A.

The adhesive layer 24 can be any suitable material that provides a better adhesion between the polycrystalline spinel layer 16 and the support substrate 22 than without the adhesive layer 24. It may be beneficial to use a material that has a relatively high thermal conductivity for the adhesive layer 24. The thermal conductivity of the adhesive layer 24 can be greater than the thermal conductivity of the polycrystalline spinel layer 16. In certain embodiments, the adhesive layer 24 can include aluminum (Al), titanium (Ti), a nitride, etc. The adhesive layer 24 can mitigate and/or reduce the chance of delamination between the polycrystalline layer substrate 16 and the support substrate 22, and/or provide a good thermal conductivity.

FIG. 5 illustrates a cross section of a surface acoustic wave resonator 4 according to an embodiment. The illustrated SAW resonator 4 includes a piezoelectric layer 10, an IDT electrode 12 over the piezoelectric layer 10, a polycrystalline spinel layer 16 below the piezoelectric layer 10, and a support substrate 22 below the polycrystalline layer 16. Unless otherwise noted, elements shown in FIG. 5 may be the same as or generally similar to like numbered elements in FIGS. 1, 2A and 4.

Unlike the embodiment shown in FIG. 1, the SAW resonator 4 illustrated in FIG. 5 does not include the temperature compensation layer 14 illustrated in FIG. 1. Such embodiments that do not include the temperature compensation layer 14 can be more preferable when the piezoelectric layer is a lithium tantalate (LT) layer than when the piezoelectric layer is a lithium niobate (LN) layer.

Figure 6A:
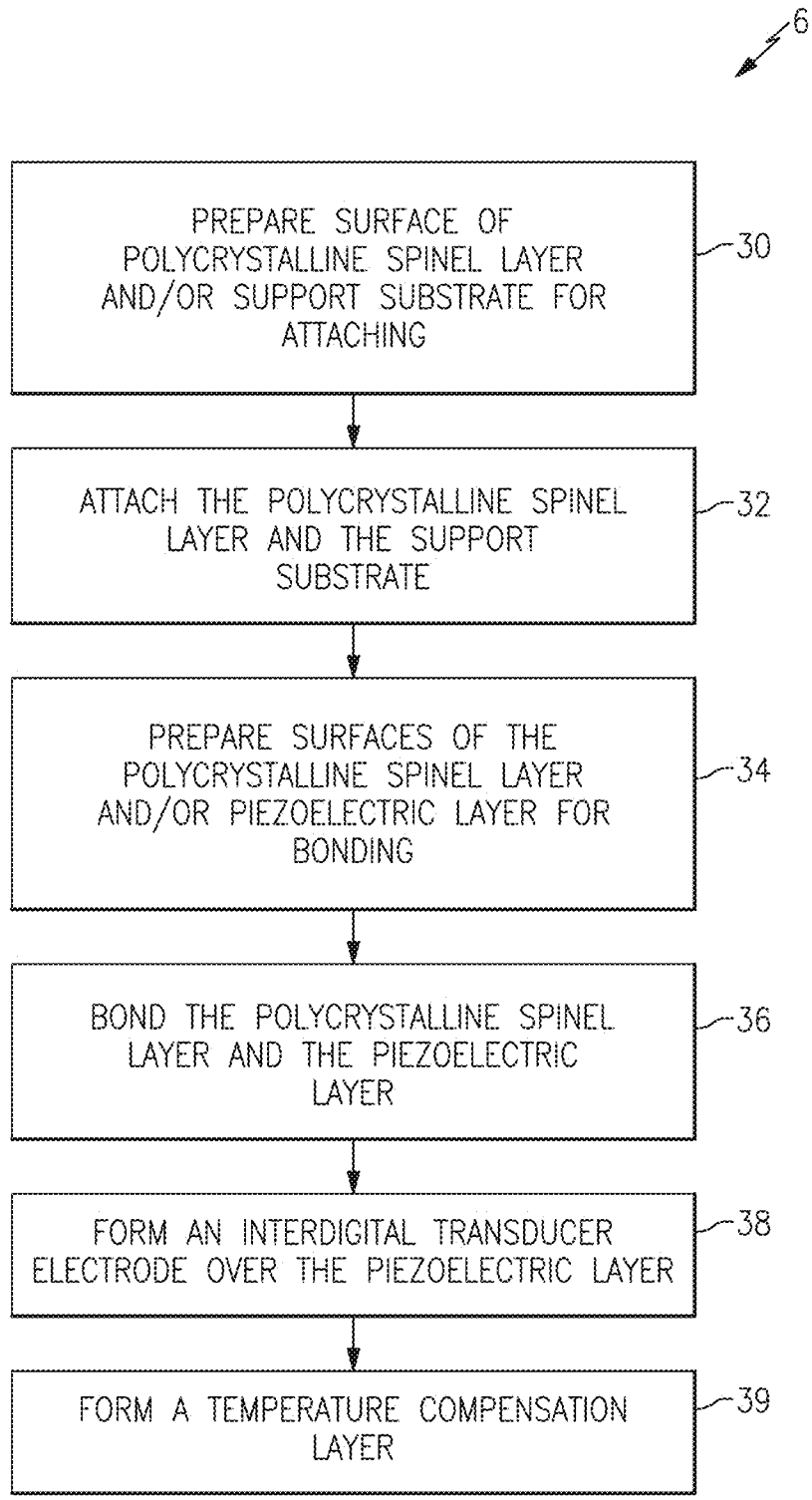
FIG. 6A is a flow chart that illustrates a manufacturing process of forming a SAW resonator according to an embodiment.

FIG. 6A is a flow chart that illustrates a manufacturing process 6 of forming a SAW device according to an embodiment. The manufacturing process 6 will now be discussed referring to the SAW resonator 1 illustrated in FIG. 1 and/or another embodiment as an example. Any suitable principles and advantages of the process 6 can be used to manufacture any SAW resonator disclosed herein. The manufacturing process 6 can be used to fabricate any suitable SAW device with a polycrystalline spinel layer. The operations of the manufacturing process 6 can be performed in any suitable order. For example, one or more of operations illustrated in FIG. 6A may be performed in a different order or sequence than illustrated as suitable.

The manufacturing process 6 includes a preparing operation 30 of preparing a surface of a polycrystalline spinel layer and/or a support substrate for attaching (e.g., bonding). A lower surface 16b of the polycrystalline spinel layer 16 and/or an upper surface 22a of the support substrate 22 of the SAW resonator 1 can be prepared for direct bonding. The preparation can include smoothing the surfaces 16b and/or 22a by way of, for example, chemical-mechanical polishing (CMP). For instance, the upper surface 22a of the support substrate 22 can be smoothed by CMP. In some embodiments, the upper surface 22a of the support substrate 22 can be smoothed so as to have a maximum surface roughness of about 2 nm or less. In such embodiments, the surface roughness of the upper surface 22a can have an average surface roughness of about 1 nm or less. The minimum surface roughness of the upper surface 22a of the support substrate 22 can be about 0.1 nm in such embodiments. Accordingly, the preparing operation 30 can involve smoothing the upper surface 22a of the support substrate 22 to a surface roughness in a range from 0.1 nm to 2 nm. The preparation operation 30 may be performed at the wafer level. In certain instances, surfaces of polycrystalline spinel layers of different SAW resonators on a same wafer can have different surface roughness.

The manufacturing process 6 also includes an attaching operation 32 of attaching a polycrystalline spinel layer to a support substrate. The attaching can involve bonding. For instance, the lower surface 16b of the polycrystalline spinel layer 16 and the upper surface 22a of the support substrate 22 of the SAW resonator 1 can be bonded together. When the surfaces 16b and/or 22a are prepared for direct bonding, as explained above, the polycrystalline spinel layer 16 and the support substrate 22 can be directly bonded without an intervening adhesive. The surfaces 16b and/or 22a of the SAW resonator 10 can be directly bonded to each other by contact without applying an external pressure and/or heat.

The attaching operation 32 can include attaching the lower surface 16b of the polycrystalline spinel layer 16 and the upper surface 22a of the support substrate 22 by way of an adhesive layer 24 illustrated in FIG. 4. In such embodiments, the preparing operation may include, alternatively or in addition, applying the adhesive layer 24 on one of the lower surface 16b of the polycrystalline spinel layer 16 or the upper surface 22a of the support substrate 22.

The manufacturing process 6 also includes another preparing operation 34 of preparing a surface of a piezoelectric layer and/or a polycrystalline spinel layer for bonding. The lower surface 10b of the piezoelectric layer 10 and/or the upper surface 16a of the polycrystalline spinel layer 16 of the SAW resonator 1 can be prepared for direct bonding. The preparation can include smoothing the surfaces 10b and/or 16a by way of, for example, chemical-mechanical polishing (CMP). For instance, the upper surface 16a of the polycrystalline spinel layer 16 can be smoothed by CMP. In some embodiments, the upper surface 16a of the polycrystalline spinel layer 16 can be smoothed so as to have a maximum surface roughness of about 2 nm or less. In such embodiments, the surface roughness of the upper surface 16a can have an average surface roughness of about 1 nm or less. The minimum surface roughness of the upper surface 16a of the polycrystalline spinel layer 16 can be about 0.1 nm in such embodiments. Accordingly, the preparing operation 34 can involve smoothing the upper surface 16a of the polycrystalline spinel layer 16 to a surface roughness in a range from 0.1 nm to 2 nm. The preparation operation 34 may be performed at the wafer level. In certain instances, surfaces of polycrystalline spinel layers of different SAW resonators on a same wafer can have different surface roughness.

The manufacturing process 6 also includes a bonding operation 36 of bonding a polycrystalline spinel layer to a piezoelectric layer. For instance, the lower surface 10b of the piezoelectric layer 10 and the upper surface 16a of the polycrystalline spinel layer 16 can be bonded together. When the surfaces 10b, 16a are prepared for direct bonding, as explained above, the piezoelectric layer 10 and the polycrystalline spinel layer 16 can be bonded without an intervening adhesive. The surfaces 10b and 16a of the SAW resonator 1 can be directly bonded to each other by contact without applying an external pressure and/or heat.

The manufacturing process 6 further includes an interdigital transducer (IDT) electrode forming operation 38 of forming an IDT electrode over a piezoelectric layer. The IDT electrode 12 is typically formed on the upper surface 10a of the piezoelectric layer 10 prior to forming the temperature compensation layer 14. The IDT electrode 12 can be formed by, for example, forming the Mo layer 18 over the piezoelectric layer 10 and forming the Al layer 20 over the Mo layer 18.

The manufacturing process 6 can also include a temperature compensation layer forming operation 39 of forming a temperature compensation layer over a piezoelectric layer and an IDT electrode. With a temperature compensation layer over a piezoelectric layer, a SAW resonator can be referred to as a temperature compensated SAW (TC-SAW) resonator. The temperature compensation layer 14 may be formed by, for example, depositing a temperature compensation material (e.g., $SiO_2$) over the piezoelectric layer 10 and the IDT electrode 12. The formation of the temperature compensation layer 14 can control the thickness T2 of the temperature compensation layer 14. For example, temperature compensation material can be deposited to have the thickness T2 in a range from 0.3 L to 0.5 L in which L is the wave length of a surface acoustic wave generated by the SAW resonator.

Figure 6B:
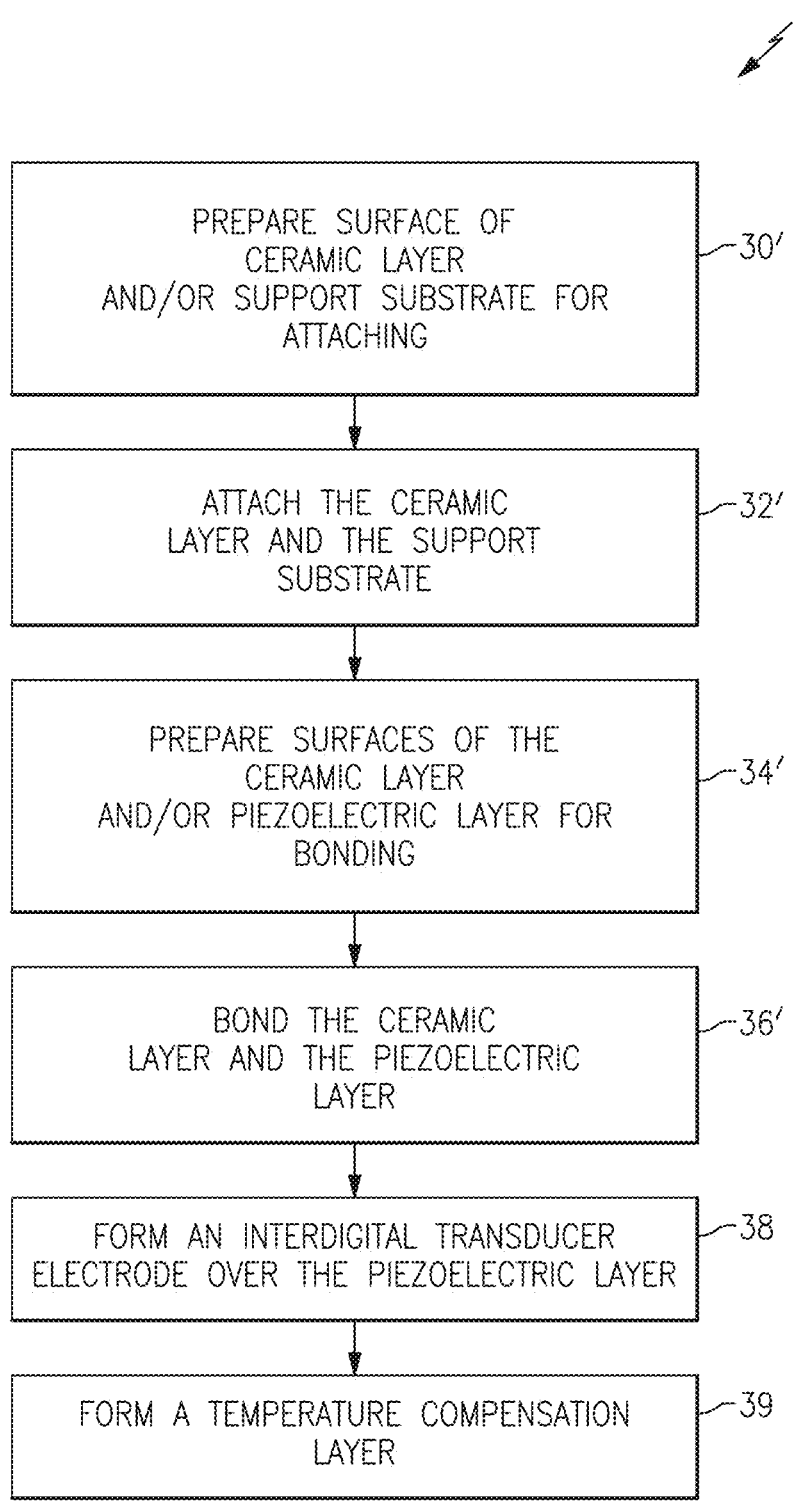
FIG. 6B is a flow chart that illustrates another manufacturing process of forming a SAW resonator according to an embodiment.

FIG. 6B is a flow chart that illustrates another manufacturing process 7 of forming a SAW resonator according to an embodiment. The manufacturing process 7 can be generally similar to the manufacturing process 6 illustrated in FIG. 6A applied to a ceramic layer. The operations of the manufacturing process 7 can be performed in any suitable order. For example, one or more of operations illustrated in FIG. 6B may be performed in a different order or sequence than illustrated as suitable.

The manufacturing process 7 includes a preparing operation 30' of preparing a surface of a ceramic layer and/or a support substrate for attaching (e.g., bonding). The manufacturing process 7 also includes an attaching operation 32' (e.g., a bonding operation) of attaching a ceramic layer to a support substrate. The manufacturing process 7 also includes another preparing operation 34' of preparing a surface of a piezoelectric layer and/or a ceramic layer for bonding. The manufacturing process 7 also includes a bonding operation 36' of bonding a ceramic layer to a piezoelectric layer. The manufacturing process 7 further includes an interdigital transducer (IDT) electrode forming operation 38 of forming an IDT electrode over a piezoelectric layer. The manufacturing process 7 can also include a temperature compensation layer forming operation 39 of forming a temperature compensation layer over a piezoelectric layer and an IDT electrode.

A filter can filter a radio frequency signal. The filter can include any one or more acoustic wave devices disclosed herein. For example, a method of manufacturing a surface acoustic wave filter can include attaching a support substrate to a ceramic layer. The support substrate has a higher thermal conductivity than the ceramic layer. The support substrate can be a single crystal substrate, such as a silicon substrate. The ceramic layer can be a polycrystalline spinel layer. The method can also include bonding a piezoelectric layer to a surface of the ceramic layer. The method can also include forming an interdigital transducer (IDT) electrode over the piezoelectric layer. The support substrate, the ceramic layer, the piezoelectric layer, and the interdigital transducer electrode can define a SAW resonator. The method can further include forming a temperature compensation layer over the IDT electrode. The method can further include electrically connecting the surface acoustic wave resonator to another surface acoustic wave resonator of the surface acoustic wave filter. The method can further include electrically connecting the surface acoustic wave resonator to a plurality of other surface acoustic wave resonators of the surface acoustic wave filter.

FIGS. 7A-7D illustrate cross sections of a SAW resonator at various steps in a manufacturing process, according to embodiment. Any suitable principles and advantages of the process illustrated in FIGS. 7A-7D can be used to manufacture any suitable SAW resonator and/or any suitable acoustic wave device disclosed herein. The manufacturing process illustrated in FIGS. 7A-7D can be used to fabricate any suitable SAW device with a polycrystalline spinel layer and/or any other suitable ceramic layer. The steps of the manufacturing process illustrated in FIGS. 7A-7D can be performed in any suitable order. For example, one or more of operations illustrated in FIGS. 7A-7D may be performed in a different order or sequence than illustrated as suitable. Acoustic wave devices in accordance with principles and advantages disclosed herein can be manufactured using some or all of the steps of the manufacturing process disclosed with reference to FIGS. 7A-7D. Although the manufacturing process associated with FIGS. 7A-7D may be described with reference to a polycrystalline spinel layer, any suitable combination of features of the manufacturing process can be applied to manufacturing any other suitable ceramic substrate.

In FIG. 7A a lower surface 16b of a polycrystalline spinel layer 16 and an upper surface 22a of a support substrate 22 are attached. In some embodiments, the polycrystalline spinel layer 16 and the support substrate 22 can be directly bonded to each other. In some other embodiments, the polycrystalline spinel layer 16 and the support substrate 22 can be bonded by way of an intervening adhesive.

In FIG. 7B, a lower surface 10b of a piezoelectric layer 10 and an upper surface 16a of the polycrystalline spinel layer 16 are bonded. In some embodiments, the piezoelectric layer 10 and the polycrystalline spinel layer 16 can be directly bonded to each other. In some other embodiments, the piezoelectric layer 10 and the polycrystalline spinel layer 16 can be bonded by way of an intervening adhesive.

In FIG. 7C, an interdigital transducer (IDT) electrode 12 is formed on an upper surface 10a of the piezoelectric layer 10. The IDT electrode 12 can be formed by, for example, forming the Mo layer 18 over the piezoelectric layer 10 and forming the Al layer 20 over the Mo layer 18.

In FIG. 7D, a temperature compensation layer 14 is formed over the piezoelectric layer 10 and the IDT electrode 12. The temperature compensation layer 14 may be formed by, for example, depositing a temperature compensation material (e.g., $SiO_2$) over the piezoelectric layer 10 and the IDT electrode 12.

FIG. 8A is a schematic diagram of an example transmit filter 45 that includes surface acoustic wave resonators of a surface acoustic wave component according to an embodiment. The transmit filter 45 can be a band pass filter. The illustrated transmit filter 45 is arranged to filter a radio frequency signal received at a transmit port TX and provide a filtered output signal to an antenna port ANT. The transmit filter 45 includes series SAW resonators TS1, TS2, TS3, TS4, TS5, TS6, and TS7, shunt SAW resonators TP1, TP2, TP3, TP4, and TP5, series input inductor L1, and shunt inductor L2. Some or all of the SAW resonators TS1, TS2, TS3, TS4, TS5, TS6, and TS7 and/or TP1, TP2, TP3, TP4, and TP5 can be a SAW resonators with a polycrystalline spinel layer over a support substrate in accordance with any suitable principles and advantages disclosed herein. For instance, one or more of the SAW resonators of the transmit filter 45 can be a surface acoustic wave resonator 1 of FIG. 1. Alternatively or additionally, one or more of the SAW resonators of the transmit filter 45 can be any surface acoustic wave resonator disclosed herein. Any suitable number of series SAW resonators and shunt SAW resonators can be included in a transmit filter 45.

FIG. 8B is a schematic diagram of a receive filter 50 that includes surface acoustic wave resonators of a surface acoustic wave component according to an embodiment. The receive filter 50 can be a band pass filter. The illustrated receive filter 50 is arranged to filter a radio frequency signal received at an antenna port ANT and provide a filtered output signal to a receive port RX. The receive filter 50 includes series SAW resonators RS1, RS2, RS3, RS4, RS5, RS6, RS7, and RS8, shunt SAW resonators RP1, RP2, RP3, RP4, RP5, and RP6, shunt inductor L2, and series output inductor L3. Some or all of the SAW resonators RS1, RS2, RS3, RS4, RS5, RS6, RS7, and RS8 and/or RP1, RP2, RP3, RP4, RP5, and RP6 can be SAW resonators with a polycrystalline spinel layer over a support substrate in accordance with any suitable principles and advantages disclosed herein. For instance, one or more of the SAW resonators of the receive filter 50 can be a surface acoustic wave resonator 1 of FIG. 1. Alternatively or additionally, one or more of the SAW resonators of the receive filter 50 can be any surface acoustic wave resonator disclosed herein. Any suitable number of series SAW resonators and shunt SAW resonators can be included in a receive filter 50.

Figure 9:
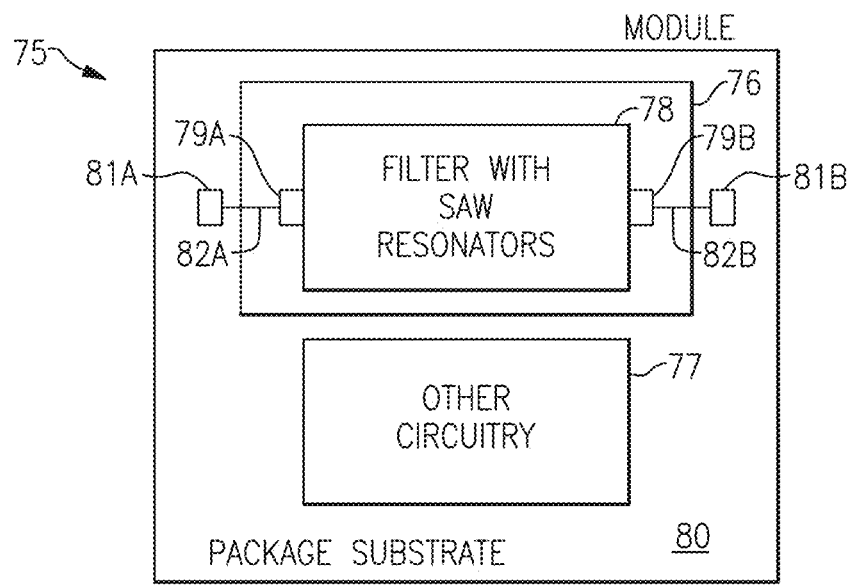
FIG. 9 is a schematic diagram of a radio frequency module that includes a surface acoustic wave resonator according to an embodiment.

FIG. 9 is a schematic diagram of a radio frequency module 75 that includes a surface acoustic wave component 76 according to an embodiment. The illustrated radio frequency module 75 includes the SAW component 76 and other circuitry 77. The SAW component 76 can include one or more SAW resonators and/or other acoustic wave devices with any suitable combination of features of the SAW resonators disclosed herein. The SAW component 76 can include a SAW die that includes SAW resonators.

The SAW component 76 shown in FIG. 9 includes a filter 78 and terminals 79A and 79B. The filter 78 includes SAW resonators. One or more of the SAW resonators can be implemented in accordance with any suitable principles and advantages of the surface acoustic wave resonator 1 of FIG. 1 and/or any surface acoustic wave resonator disclosed herein. The filter 78 can be a TC-SAW filter arranged as a band pass filter to filter radio frequency signals with frequencies below about 3.5 GHz in certain applications. The terminals 79A and 78B can serve, for example, as an input contact and an output contact. The SAW component 76 and the other circuitry 77 are on a common packaging substrate 80 in FIG. 9. The package substrate 80 can be a laminate substrate. The terminals 79A and 79B can be electrically connected to contacts 81A and 81B, respectively, on the packaging substrate 80 by way of electrical connectors 82A and 82B, respectively. The electrical connectors 82A and 82B can be bumps or wire bonds, for example. The other circuitry 77 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 75 can include one or more packaging structures to, for example, provide protection and/or facilitate easier handling of the radio frequency module 75. Such a packaging structure can include an overmold structure formed over the packaging substrate 75. The overmold structure can encapsulate some or all of the components of the radio frequency module 75.

Figure 10:
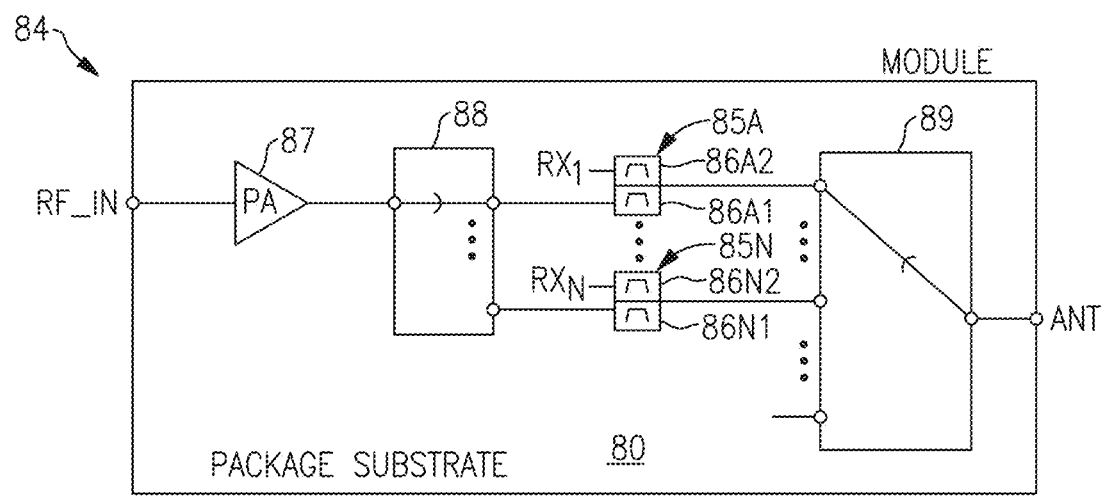
FIG. 10 is a schematic diagram of a radio frequency module that includes filters with surface acoustic wave resonators according to an embodiment.

FIG. 10 is a schematic diagram of a radio frequency module 84 that includes a surface acoustic wave component according to an embodiment. As illustrated, the radio frequency module 84 includes duplexers 85A to 85N that include respective transmit filters 86A1 to 86N1 and respective receive filters 86A2 to 86N2, a power amplifier 87, a select switch 88, and an antenna switch 89. In some instances, the module 84 can include one or more low noise amplifiers configured to receive a signal from one or more receive filters of the receive filters 86A2 to 86N2. The radio frequency module 84 can include a package that encloses the illustrated elements. The illustrated elements can be disposed on a common packaging substrate 80. The packaging substrate can be a laminate substrate, for example.

The duplexers 85A to 85N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 86A1 to 86N1 can include one or more SAW resonators in accordance with any suitable principles and advantages disclosed herein. Similarly, one or more of the receive filters 86A2 to 86N2 can include one or more SAW resonators in accordance with any suitable principles and advantages disclosed herein. Although FIG. 10 illustrates duplexers, any suitable principles and advantages disclosed herein can be implemented in other multiplexers (e.g., quadplexers, hexaplexers, octoplexers, etc.) and/or in switch-plexers. Such multiplexers can include multiplexers with fixed multiplexing, multiplexers with switched multiplexing, or multiplexers with a combination of switched multiplexing and fixed multiplexing.

The power amplifier 87 can amplify a radio frequency signal. The illustrated switch 88 is a multi-throw radio frequency switch. The switch 88 can electrically couple an output of the power amplifier 87 to a selected transmit filter of the transmit filters 86A1 to 86N1. In some instances, the switch 88 can electrically connect the output of the power amplifier 87 to more than one of the transmit filters 86A1 to 86N1. The antenna switch 89 can selectively couple a signal from one or more of the duplexers 85A to 85N to an antenna port ANT. The duplexers 85A to 85N can be associated with different frequency bands and/or different modes of operation (e.g., different power modes, different signaling modes, etc.).

Figure 11:
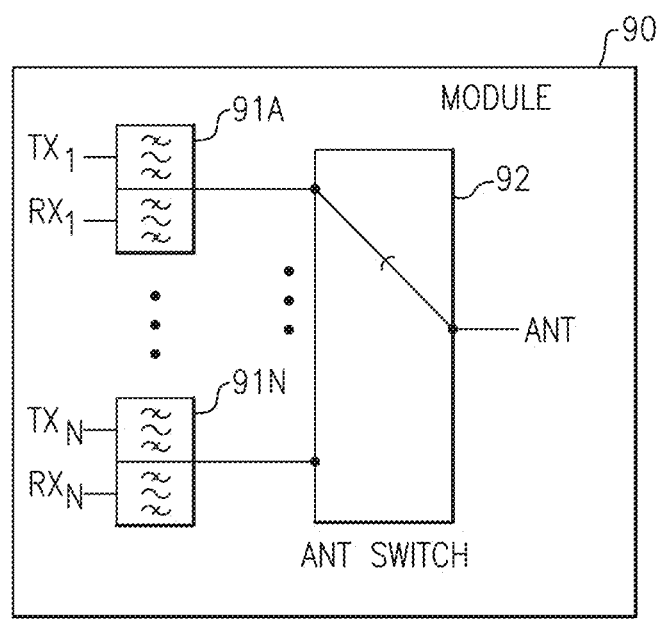
FIG. 11 is a schematic block diagram of a module that includes an antenna switch and duplexers that include a surface acoustic wave resonator according to an embodiment.

FIG. 11 is a schematic block diagram of a module 90 that includes duplexers 91A to 91N and an antenna switch 92. One or more filters of the duplexers 91A to 91N can include any suitable number of surface acoustic wave resonators in accordance with any suitable principles and advantages discussed herein. Any suitable number of duplexers 91A to 91N can be implemented. The antenna switch 92 can have a number of throws corresponding to the number of duplexers 91A to 91N. The antenna switch 92 can electrically couple a selected duplexer to an antenna port of the module 90.

Figure 12A:
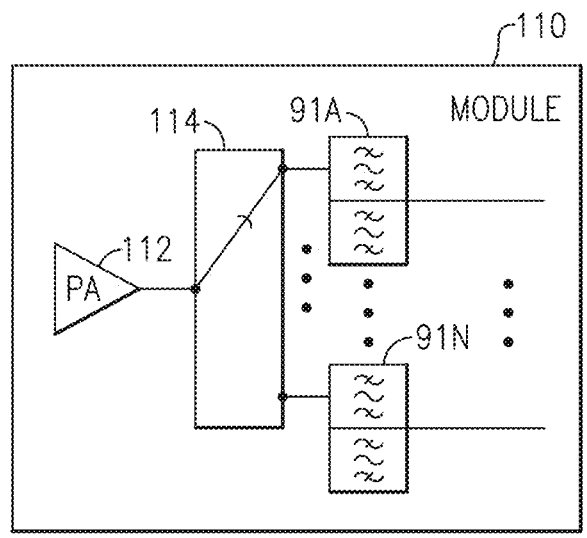
FIG. 12A is a schematic block diagram of a module that includes a power amplifier, a radio frequency switch, and duplexers that include a surface acoustic wave resonator according to an embodiment.

FIG. 12A is a schematic block diagram of a module 110 that includes a power amplifier 112, a radio frequency switch 114, and duplexers 91A to 91N in accordance with one or more embodiments. The power amplifier 112 can amplify a radio frequency signal. The radio frequency switch 114 can be a multi-throw radio frequency switch. The radio frequency switch 114 can electrically couple an output of the power amplifier 112 to a selected transmit filter of the duplexers 91A to 91N. One or more filters of the duplexers 91A to 91N can include any suitable number of surface acoustic wave resonators with a polycrystalline spinel layer over a support substrate in accordance with any suitable principles and advantages discussed herein. Any suitable number of duplexers 91A to 91N can be implemented.

Figure 12B:
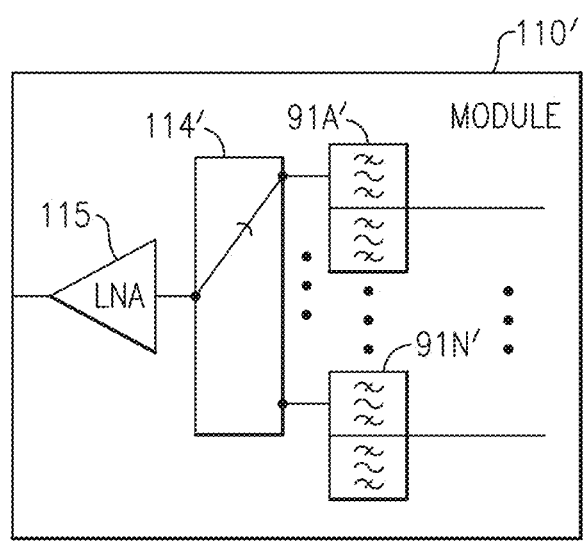
FIG. 12B is a schematic block diagram of a module that includes filters, a radio frequency switch, and a low noise amplifier according to an embodiment.

FIG. 12B is a schematic block diagram of a module 110' that includes filters 91A' to 91N', a radio frequency switch 114', and a low noise amplifier 115 according to an embodiment. One or more filters of the filters 91A' to 91N' can include any suitable number of acoustic wave resonators in accordance with any suitable principles and advantages disclosed herein. Any suitable number of filters 91A' to 91N' can be implemented. The illustrated filters 91A' to 91N' are receive filters. In some embodiments, one or more of the filters 91A' to 91N' can be included in a multiplexer that also includes a transmit filter. The radio frequency switch 114' can be a multi-throw radio frequency switch. The radio frequency switch 114' can electrically couple an output of a selected filter of filters 91A' to 91N' to the low noise amplifier 115. In some embodiments (not illustrated), a plurality of low noise amplifiers can be implemented. The module 110' can include diversity receive features in certain applications.

Figure 13A:
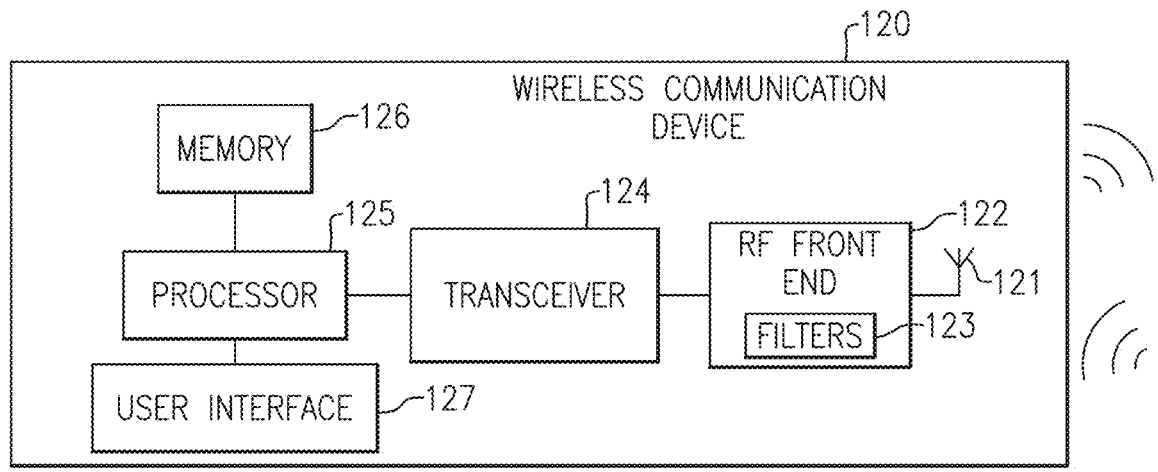
FIG. 13A is a schematic block diagram of a wireless communication device that includes a filter with a surface acoustic wave resonator in accordance with one or more embodiments.

FIG. 13A is a schematic diagram of a wireless communication device 120 that includes filters 123 in a radio frequency front end 122 according to an embodiment. The filters 123 can include one or more SAW resonators in accordance with any suitable principles and advantages discussed herein. The wireless communication device 120 can be any suitable wireless communication device. For instance, a wireless communication device 120 can be a mobile phone, such as a smart phone. As illustrated, the wireless communication device 120 includes an antenna 121, an RF front end 122, a transceiver 124, a processor 125, a memory 126, and a user interface 127. The antenna 121 can transmit/receive RF signals provided by the RF front end 122. Such RF signals can include carrier aggregation signals. Although not illustrated, the wireless communication device 120 can include a microphone and a speaker in certain applications.

The RF front end 122 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 122 can transmit and receive RF signals associated with any suitable communication standards. The filters 123 can include SAW resonators of a SAW component that includes any suitable combination of features discussed with reference to any embodiments discussed above.

The transceiver 124 can provide RF signals to the RF front end 122 for amplification and/or other processing. The transceiver 124 can also process an RF signal provided by a low noise amplifier of the RF front end 122. The transceiver 124 is in communication with the processor 125. The processor 125 can be a baseband processor. The processor 125 can provide any suitable base band processing functions for the wireless communication device 120. The memory 126 can be accessed by the processor 125. The memory 126 can store any suitable data for the wireless communication device 120. The user interface 127 can be any suitable user interface, such as a display with touch screen capabilities.

Figure 13B:
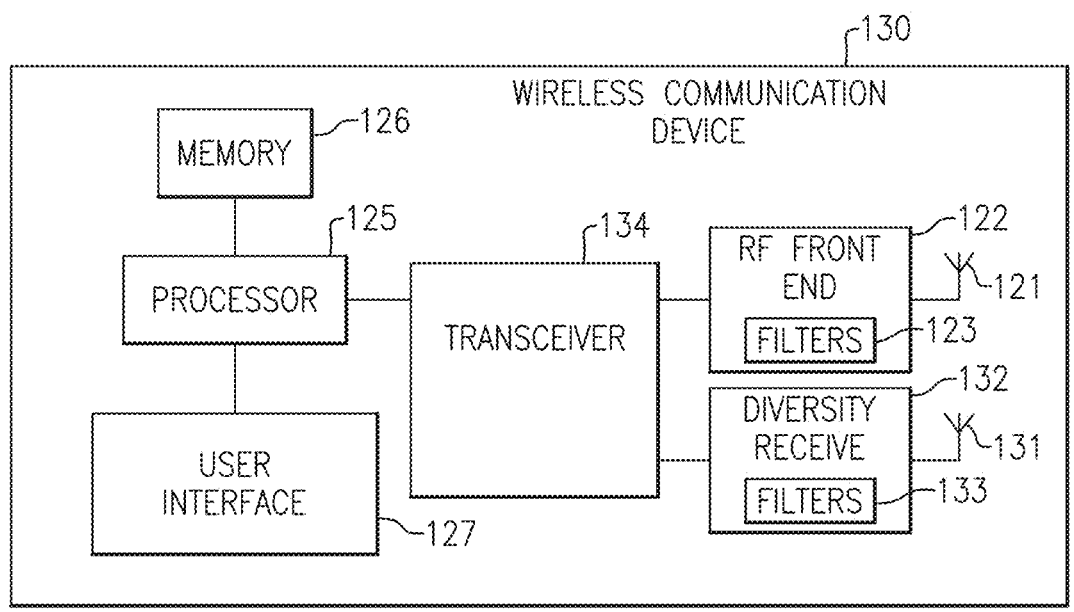
FIG. 13B is a schematic block diagram of another wireless communication device that includes a filter with a surface acoustic wave resonator in accordance with one or more embodiments.

FIG. 13B is a schematic diagram of a wireless communication device 130 that includes filters 123 in a radio frequency front end 122 and a second filter 133 in a diversity receive module 132. The wireless communication device 130 is like the wireless communication device 100 of FIG. 13A, except that the wireless communication device 130 also includes diversity receive features. As illustrated in FIG. 13B, the wireless communication device 130 includes a diversity antenna 131, a diversity module 132 configured to process signals received by the diversity antenna 131 and including filters 133, and a transceiver 134 in communication with both the radio frequency front end 122 and the diversity receive module 132. The filters 133 can include one or more SAW resonators that include any suitable combination of features discussed with reference to any embodiments discussed above.

Acoustic wave devices disclosed herein can be implemented in a standalone filter. Acoustic wave devices disclosed herein can be implemented in one or more filters of multiplexer (e.g., a duplexer) with fixed multiplexing. Acoustic wave devices disclosed herein can be implemented in one or more filters of multiplexer with switched multiplexing. Acoustic wave devices disclosed herein can be implemented in one or more filters of a multiplexer with a combination of fixed multiplexing and switched multiplexing.

The 3rd Generation Partnership Project (3GPP) is a collaboration between groups of telecommunications standard bodies across the world. The technical specifications controlled by 3GPP can be expanded and revised by specification releases, which can span multiple years and specify a breadth of new features and evolutions. 3GPP introduced Phase 1 of fifth generation (5G) technology in Release 15, and plans to introduce Phase 2 of 5G technology in Release 16 (targeted for 2020). Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

An acoustic wave device including any suitable combination of features disclosed herein be included in a filter arranged to filter a radio frequency signal in a fifth generation (5G) New Radio (NR) operating band within Frequency Range 1 (FR1). A filter arranged to filter a radio frequency signal in a 5G NR operating band can include one or more SAW devices disclosed herein. FR1 can be from 410 MHz to 7.125 GHz, for example, as specified in a current 5G NR specification. One or more acoustic wave devices in accordance with any suitable principles and advantages disclosed herein can be included in a filter arranged to filter a radio frequency signal in a 4G LTE operating band and/or in a filter having a passband that includes a fourth generation (4G) Long Term Evolution (LTE) operating band and a 5G NR operating band.

Figure 14:
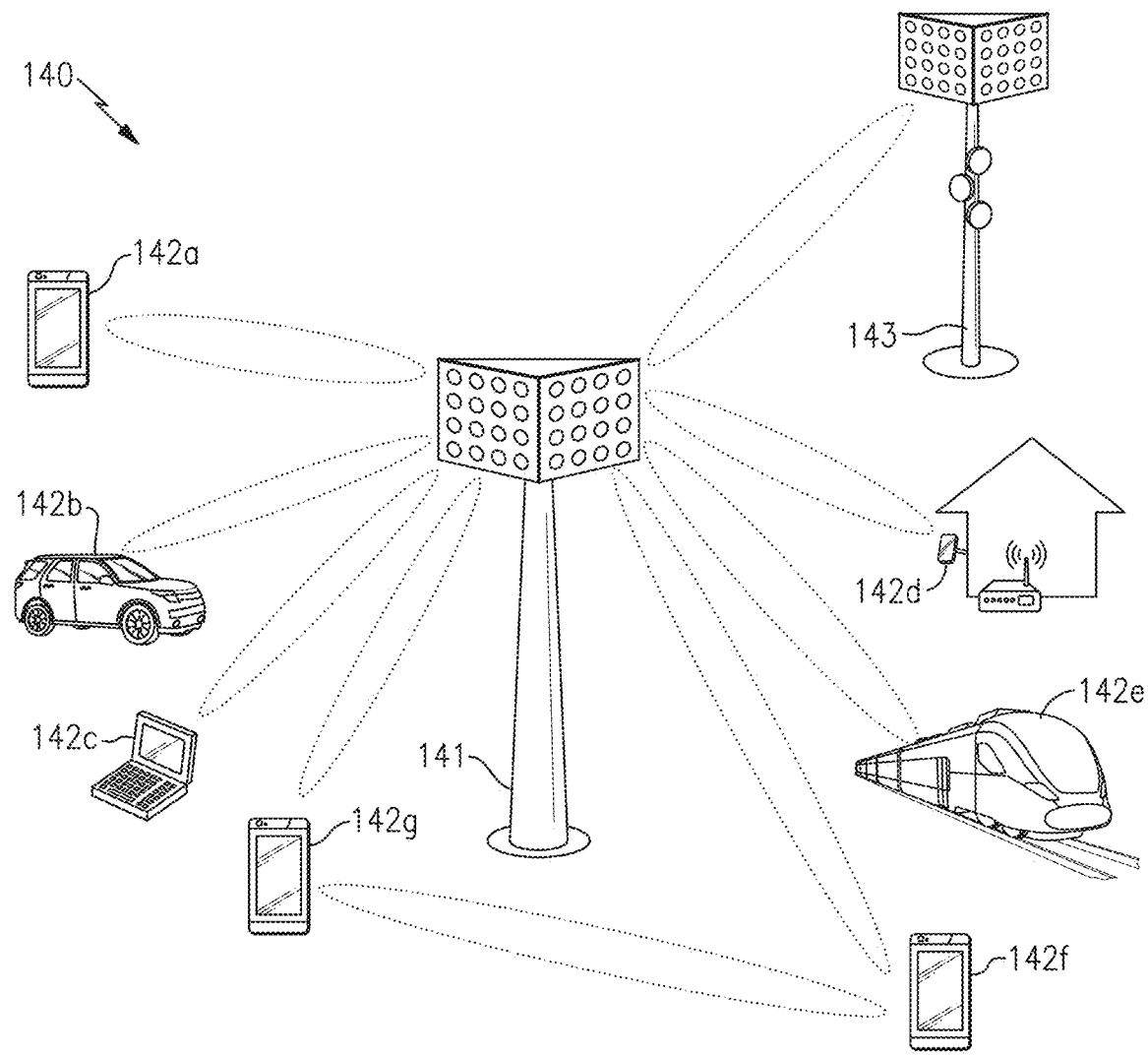
FIG. 14 is a schematic diagram of one example of a communication network.

FIG. 14 is a schematic diagram of one example of a communication network 140. The communication network 140 includes a macro cell base station 141, a small cell base station 143, and various examples of user equipment (UE), including a first mobile device 142a, a wireless-connected car 142b, a laptop 142c, a stationary wireless device 142d, a wireless-connected train 142e, a second mobile device 142f, and a third mobile device 142g. One or more of the macro cell base station 141, the small cell base station 143, or UEs illustrated in FIG. 14 can implement one or more of the acoustic wave devices (e.g., SAW resonators) disclosed herein.

Although specific examples of base stations and user equipment are illustrated in FIG. 14, a communication network can include base stations and user equipment of a wide variety of types and/or numbers.

For instance, in the example shown, the communication network 140 includes the macro cell base station 141 and the small cell base station 143. The small cell base station 143 can operate with relatively lower power, shorter range, and/or with fewer concurrent users relative to the macro cell base station 141. The small cell base station 143 can also be referred to as a femtocell, a picocell, or a microcell. Although the communication network 140 is illustrated as including two base stations, the communication network 140 can be implemented to include more or fewer base stations and/or base stations of other types.

Although various examples of user equipment are shown, the teachings herein are applicable to a wide variety of user equipment, including, but not limited to, mobile phones, tablets, laptops, Internet of Things (IoT) devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 140 of FIG. 14 supports communications using a variety of cellular technologies, including, for example, 4G LTE and 5G NR. In certain implementations, the communication network 140 is further adapted to provide a wireless local area network (WLAN), such as WiFi. Although various examples of communication technologies have been provided, the communication network 140 can be adapted to support a wide variety of communication technologies.

Various communication links of the communication network 140 have been depicted in FIG. 14. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 14, the communication links include not only communication links between UE and base stations, but also UE to UE communications and base station to base station communications. For example, the communication network 140 can be implemented to support self-fronthaul and/or self-backhaul (for instance, as between mobile device 142g and mobile device 142f).

The communication links can operate over a wide variety of frequencies. In certain implementations, communications are supported using 5G NR technology over one or more frequency bands that are less than 6 Gigahertz (GHz) and/or over one or more frequency bands that are greater than 6

GHz. For example, the communication links can serve Frequency Range 1 (FR1), Frequency Range 2 (FR2), or a combination thereof. An acoustic wave filter including at least one acoustic wave device disclosed herein can filter a radio frequency signal within FR1. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 140 can share available network resources, such as available frequency spectrum, in a wide variety of ways. In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 140 of FIG. 14 can be used to support a wide variety of advanced communication features, including, but not limited to, eMBB, uRLLC, and/or mMTC.

Out of band rejection can be improved by suppressing back reflection by implementing any suitable principles and advantages discussed herein. For example, a polycrystalline spinel substrate and/or any other suitable ceramic substrate, implemented in accordance with any suitable principles and advantages disclosed herein can scatter back reflections by a beam scattering feature of the polycrystalline spinel substrate. This can improve out of band rejection. Reduced out of band rejection can be advantageous in various 5G NR applications, such as applications involving carrier aggregation. Example carrier aggregations will be discussed with reference to FIGS. 15A to 15C. In carrier aggregation applications, suppressing out of band rejection for a filter for a component carrier in a frequency range for another component carrier of the carrier aggregation can increase performance.

Figure 15A:
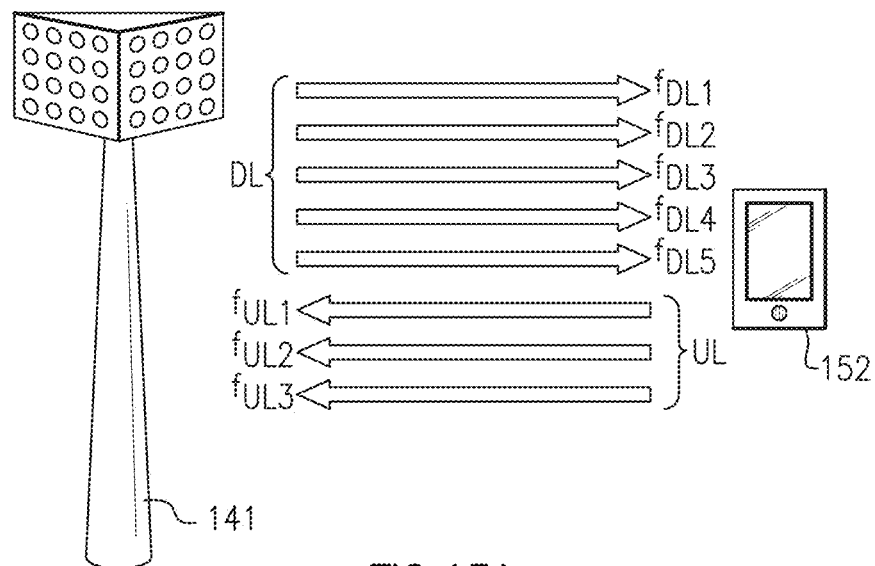
FIG. 15A is a schematic diagram of one example of a communication link using carrier aggregation.

FIG. 15A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 141 and a mobile device 152. As shown in FIG. 15A, the communications link includes a downlink channel used for RF communications from the base station 141 to the mobile device 152, and an uplink channel used for RF communications from the mobile device 152 to the base station 141.

Although FIG. 15A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 141 and the mobile device 152 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 15A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 15B:
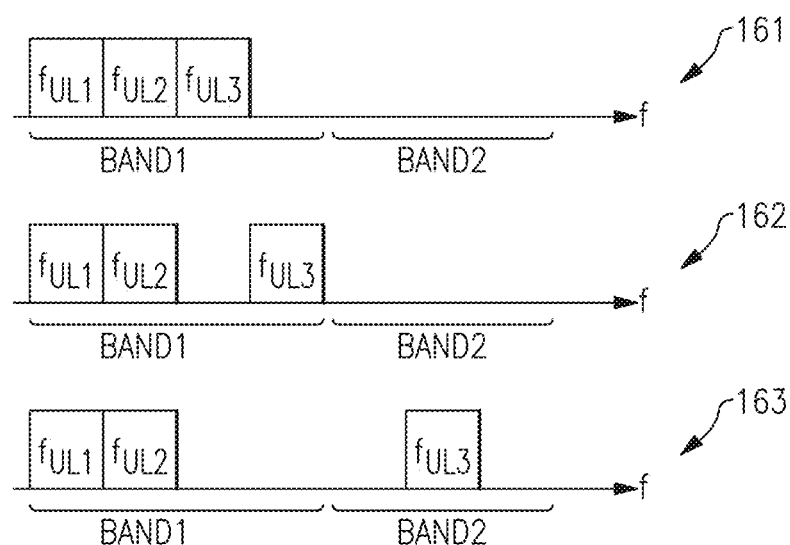
FIG. 15B illustrates various examples of uplink carrier aggregation for the communication link of FIG. 2A.

FIG. 15B illustrates various examples of uplink carrier aggregation for the communication link of FIG. 15A. FIG. 15B includes a first carrier aggregation scenario 161, a second carrier aggregation scenario 162, and a third carrier aggregation scenario 163, which schematically depict three types of carrier aggregation.

The carrier aggregation scenarios 161-163 illustrate different spectrum allocations for a first component carrier $f_{UL1}$, a second component carrier $f_{UL2}$, and a third component carrier $f_{UL3}$. Although FIG. 15B is illustrated in the context of aggregating three component carriers, carrier aggregation can be used to aggregate more or fewer carriers.

Moreover, although illustrated in the context of uplink, the aggregation scenarios are also applicable to downlink.

The first carrier aggregation scenario 161 illustrates intra-band contiguous carrier aggregation, in which component carriers that are adjacent in frequency and in a common frequency band are aggregated. For example, the first carrier aggregation scenario 161 depicts aggregation of component carriers $f_{UL1}$, $f_{UL2}$, and $f_{UL3}$ that are contiguous and located within a first frequency band BAND1.

With continued reference to FIG. 15B, the second carrier aggregation scenario 162 illustrates intra-band non-continuous carrier aggregation, in which two or more components carriers that are non-adjacent in frequency and within a common frequency band are aggregated. For example, the second carrier aggregation scenario 162 depicts aggregation of component carriers $f_{UL1}$, $f_{UL2}$, and $f_{UL3}$ that are non-contiguous, but located within a first frequency band BAND1.

The third carrier aggregation scenario 163 illustrates inter-band non-contiguous carrier aggregation, in which component carriers that are non-adjacent in frequency and in multiple frequency bands are aggregated. For example, the third carrier aggregation scenario 163 depicts aggregation of component carriers $f_{UL1}$ and $f_{UL2}$ of a first frequency band BAND1 with component carrier $f_{UL3}$ of a second frequency band BAND2.

Figure 15C:
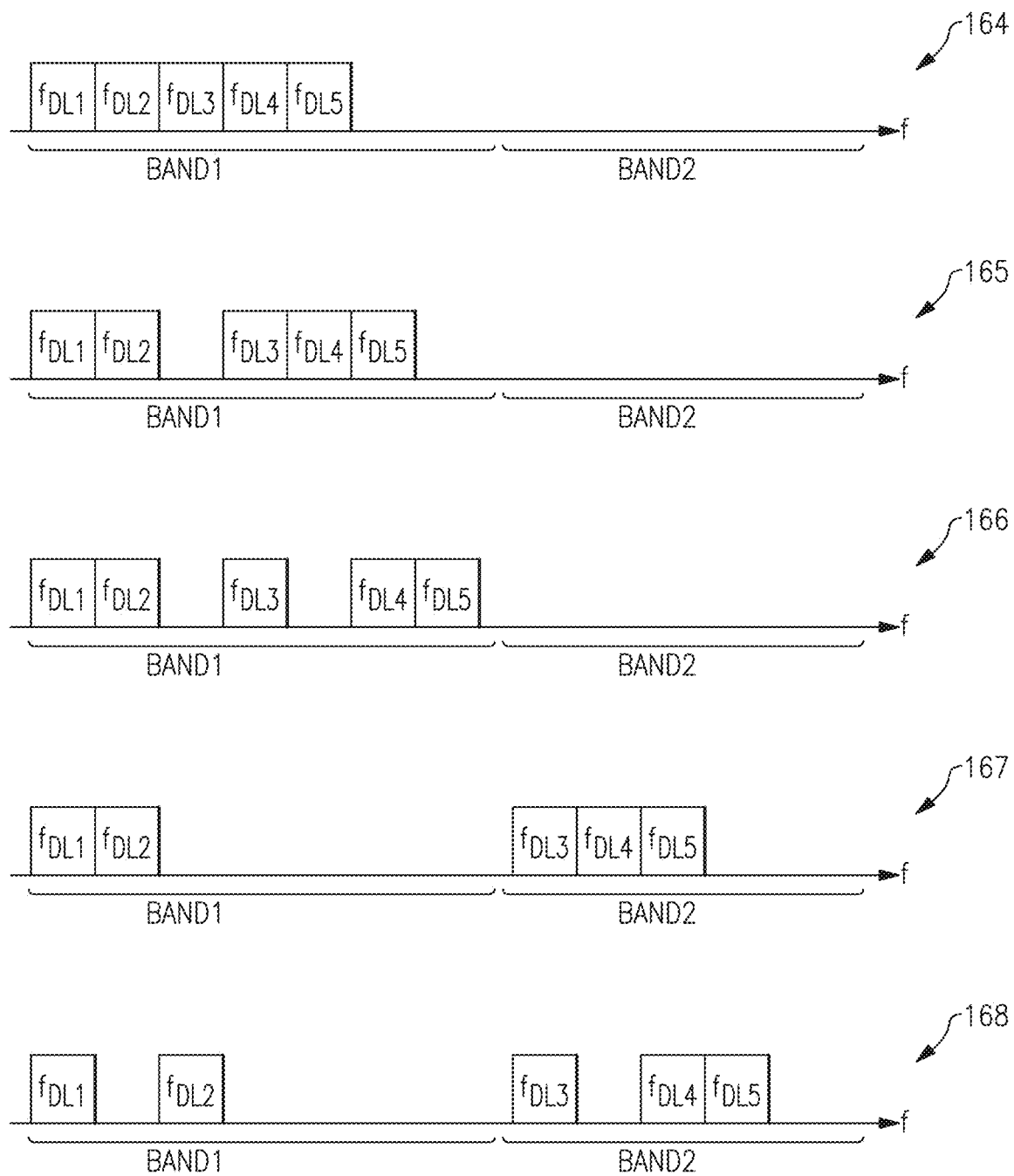
FIG. 15C illustrates various examples of downlink carrier aggregation for the communication link of FIG. 2A.

FIG. 15C illustrates various examples of downlink carrier aggregation for the communication link of FIG. 15A. The examples depict various carrier aggregation scenarios 164-168 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 15C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 164 depicts aggregation of component carriers that are contiguous and located within the same frequency band. Additionally, the second carrier aggregation scenario 165 and the third carrier aggregation scenario 166 illustrates two examples of aggregation that are non-contiguous, but located within the same frequency band. Furthermore, the fourth carrier aggregation scenario 167 and the fifth carrier aggregation scenario 168 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 15A-15C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink.

Acoustic wave devices disclosed herein can have relatively high power durability. The relatively high thermal conductivity of the support substrate of the acoustic wave devices disclosed herein can be advantageous for handling relatively high power in 5G NR applications. For example, acoustic wave devices disclosed herein can dissipate heat associated with higher TDD duty cycles in 5G NR applications, such as will be described with reference to FIG. 16B.

Figure 16A:
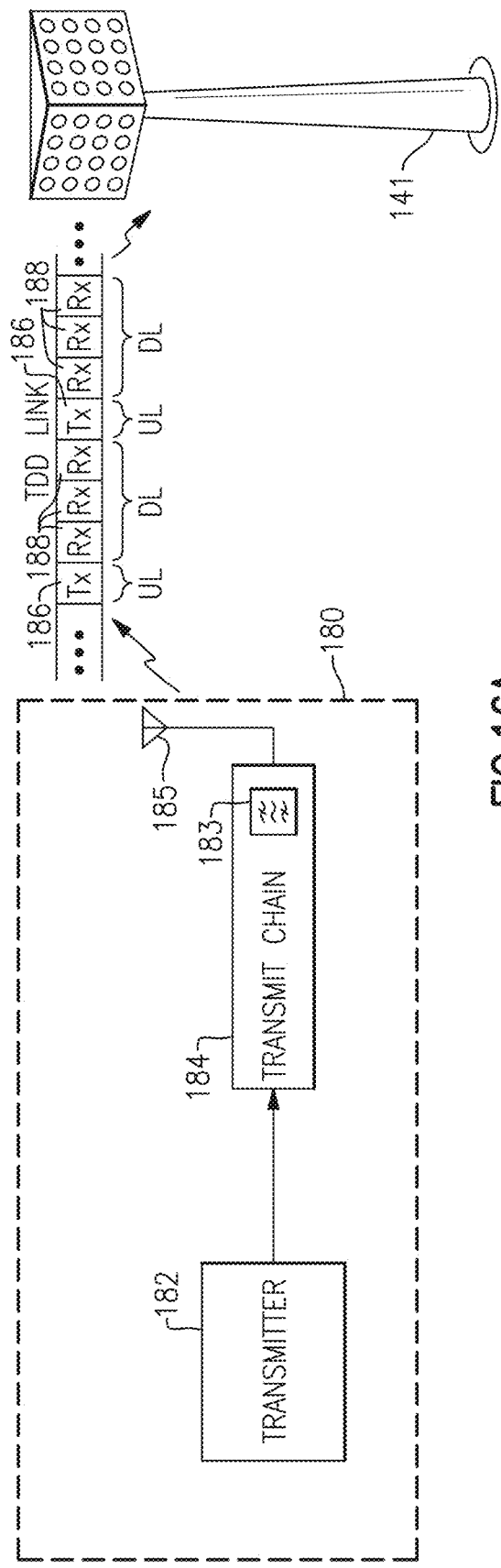
FIG. 16A is a schematic diagram of one embodiment of a radio frequency (RF) communication system with a wireless communication device with a first transmit duty cycle.

FIG. 16A is a schematic diagram of an RF communication system 180 with dynamic waveform control and power boost. The RF communication system 180 can correspond to a UE, and is in communication with the base station 141 at least over a TDD communication link. Although not shown in FIG. 16A for clarity of the figure, the RF communication system 180 can wirelessly communicate with the base station 141 over one or more other communication links, for instance, over one or more FDD communication links and/or over one or more additional TDD communication links.

The RF communication system 180 includes a transmitter 182, a transmit chain 184, and an antenna 185. The transmitter 182 can includes, for example, a gain selection circuit, and a waveform selection circuit. In one example, the RF communication system 180 further includes a receive chain and a receiver, which process signals received from the antenna 185 and/or another antenna.

The transmitter 182 generates an RF signal, which is provided to the transmit chain 184 for amplification and other signal conditioning. The transmit chain 184 includes at least a filter 183, which provides an RF transmit signal to the antenna 185 for wireless transmission over the TDD communication link. The filter 183 can include one or more of the acoustic devices disclosed herein, such as the SAW resonator 1 illustrated in FIG. 1.

As shown in FIG. 16A, the TDD communication link includes transmit (Tx) and receive (Rx) time slots, such as Tx time slots 186 and Rx time slots 188. The Tx time slots 186 corresponding to uplink (UL) communications in which the RF communication system 180 is permitted to transmit to the base station 141 over the TDD communication link. Additionally, the Rx time slots 188 corresponding to downlink (DL) communications in which the RF communication system 180 is permitted to receive transmissions from the base station 141 over the TDD communication link. In certain implementations, the timing of when the time slots occur is controlled at the network level.

The TDD communication link has a transmit duty cycle corresponding to a fraction of the time slots dedicated to UL communications. For instance, in this example shown in FIG. 16A, the transmit duty cycle is 25% corresponding to about one-quarter of the time slots dedicated to transmit communications. In the example shown in FIG. 16A, transmit communications are uplink communications. Although an example with a 25% transmit duty cycle is shown, the transmit duty cycle of a TDD communication link can have a variety of different values and can change over time with network usage, radio environment, and/or a variety of other factors. In certain implementations, the TDD communication link corresponds to wireless communications over at least one 3GPP frequency band, such as a 5G NR band.

Figure 16B:
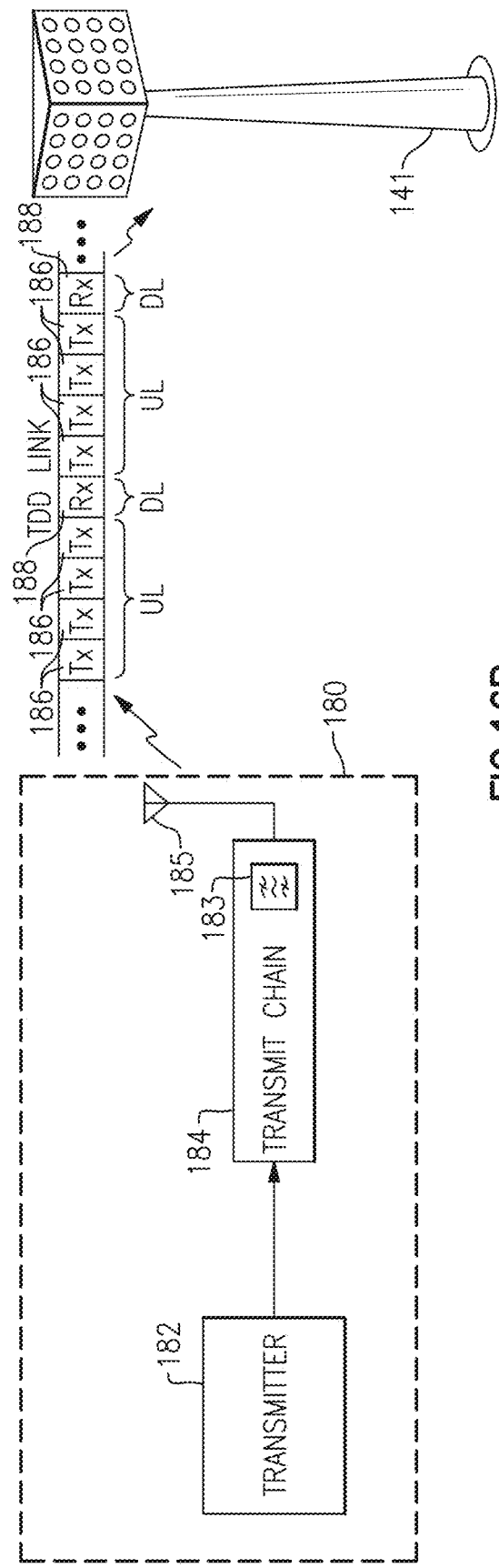
FIG. 16B is a schematic diagram of another embodiment of an RF communication system with a wireless communication device with second transmit duty cycle that is higher than the first transmit duty cycle.

FIG. 16B is a schematic diagram of the RF communication system 180 with dynamic waveform control and power boost transmitting with a different transmit duty cycle from the duty cycle shown in FIG. 16A. In certain 5G NR applications, higher TDD transmit duty cycles are implemented than in 4G LTE applications. Since transmit power is higher than receive power, higher TDD transmit duty cycles lead to higher power. The acoustic wave devices disclosed herein can be advantageous in handling such higher power. In FIG. 16B, the transmit duty cycle is 75% corresponding to three-quarters of the time slots dedicated to TDD transmit communications. In certain implementations, the TDD communication link corresponds to wireless communications over at least one 3GPP frequency band, such as a 5G NR band.

There can be higher peak to average power ratios in 5G NR applications than in 4G LTE applications. The relatively high power durability of acoustic wave devices disclosed herein can be advantageous in such higher peak to average power ratio applications. Peak to average power ration will be discussed with reference to FIGS. 17A to 17B.

Figure 17A:
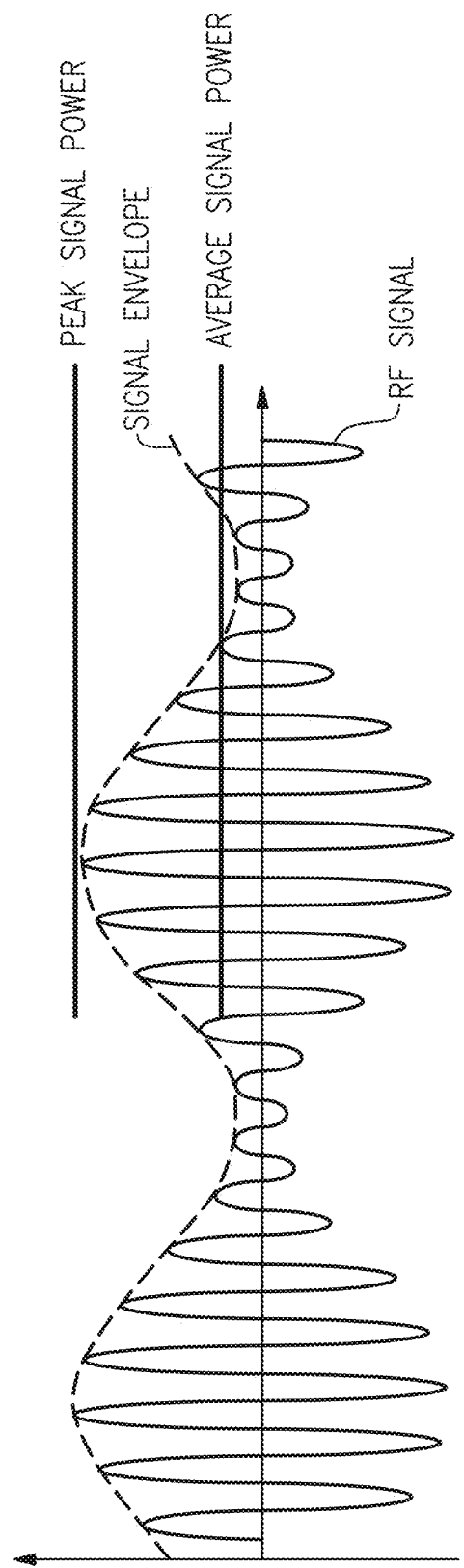
FIG. 17A is a graph illustrating one example of an RF signal waveform versus time.

FIG. 17A is a graph illustrating one example of an RF signal waveform versus time. The graph depicts the RF signal waveform, the envelope of the RF signal, the average signal power, and the peak signal power. The peak to average power ratio (PAPR) or crest factor of the RF signal waveform corresponds to the ratio of the waveform's peak signal power to the waveform's average signal power.

Figure 17B:
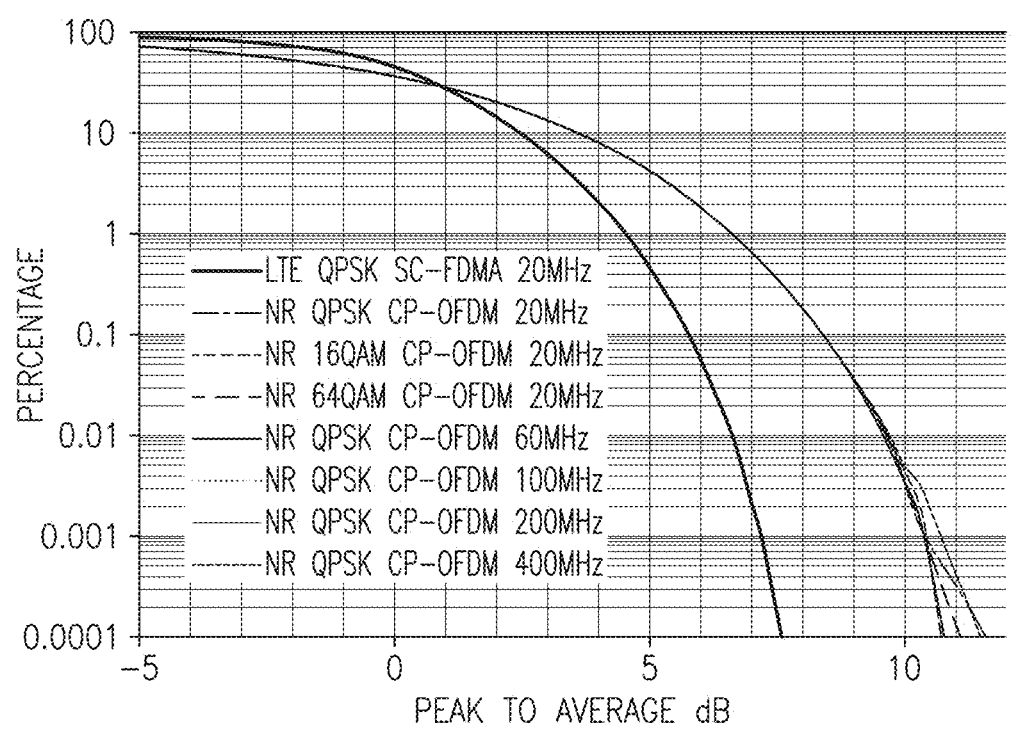
FIG. 17B is one example of a peak to average power ratio (PAPR) complementary cumulative distribution function (CCDF) for various cyclic prefix orthogonal frequency division multiplexing (CP-OFDM) waveforms relative to a single carrier frequency division multiple access (SC-FDMA) reference waveform.

FIG. 17B is one example of a PAPR complementary cumulative distribution function (CCDF) for various cyclic prefix orthogonal frequency division multiplexing (CP-OFDM) waveforms relative to a single carrier frequency division multiple access (SC-FDMA) reference waveform.

As shown in FIG. 17B, the PAPR CCDF is shown for a variety of modulation orders and bandwidths of CP-OFDM 5G NR waveforms. For the example waveforms shown, higher order modulations and wider signal bandwidth does not substantially increase PAPR, but rather the CP-OFDM waveforms have similar PAPR to one another.

When comparing 5G NR CP-OFDM waveforms to the reference LTE SC-FDMA QPSK waveform it can be seen that the 5G NR waveforms exhibit higher PAPR of about 3 dB or more. Higher PAPR can increase power handling demands on acoustic wave filters. The higher PAPR also raises a linearity constraint for a power amplifier. Moreover, for UE operating at a cell edge and/or with poor SNR, higher PAPR can constrain output power and/or increase battery current.

Although embodiments disclosed herein relate to surface acoustic wave resonators, any suitable principles and advantages disclosed herein can be applied to other types of acoustic wave resonators, such as Lamb wave resonators and/or boundary wave resonators and/or any other types of acoustic wave devices.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 KHz to 300 GHz, such as in a frequency range from about 450 MHz to 8.5 GHz.

Aspects of this disclosure can be implemented in various electronic devices. Examples of the electronic devices can include, but are not limited to, consumer electronic products, parts of the consumer electronic products such as die and/or acoustic wave filter assemblies and/or packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave filter comprising:
   a first acoustic wave resonator including a support substrate, a ceramic layer over the support substrate, the ceramic layer having a thickness that is at least equal to or greater than a wavelength $\lambda$ of the first acoustic wave resonator, the ceramic layer configured to scatter back reflections to reduce spurious modes associated with back reflections, and the support substrate having a higher thermal conductivity than the ceramic layer, a piezoelectric layer over the ceramic layer, and at least a first interdigital transducer electrode over the piezoelectric layer; and
   electrically connecting the first acoustic wave resonator to at least a second acoustic wave resonator.

2. The acoustic wave filter of claim 1 wherein the ceramic layer comprises magnesium aluminate.

3. The acoustic wave filter of claim 1 wherein the ceramic layer comprises polycrystalline aluminum nitride.

4. The acoustic wave filter of claim 1 wherein an acoustic wave of the first acoustic wave resonator has a wavelength of $\lambda$, and the piezoelectric layer has a thickness in a range from $3\lambda$ to $40\lambda$.

5. The acoustic wave filter of claim 1 wherein a surface of the ceramic layer has a surface roughness in a range from 0.1 nanometers to 2 nanometers.

6. The acoustic wave filter of claim 1 wherein the ceramic layer and the piezoelectric layer are directly bonded to each other without an intervening layer.

7. The acoustic wave filter of claim 1 wherein the ceramic layer and the support substrate are bonded to each other by way of an adhesive.

8. The acoustic wave filter of claim 1 further comprising a temperature compensation layer over the first interdigital transducer electrode.

9. The acoustic wave filter of claim 1 wherein the piezoelectric layer includes lithium based piezoelectric layer.

10. A method of manufacturing an acoustic wave filter that filters a radio frequency signal, the method comprising:
    forming a first acoustic wave resonator by attaching a support substrate to a ceramic layer, the ceramic layer having a thickness that is at least equal to or greater than a wavelength $\lambda$ of the first acoustic wave resonator, the ceramic layer configured to scatter back reflections to reduce spurious modes associated with back reflections, and the support substrate having a higher thermal conductivity than the ceramic layer, bonding a piezoelectric layer to a surface of the ceramic layer, and forming at least a first interdigital transducer electrode over the piezoelectric layer; and
    electrically connecting the first acoustic wave resonator to at least a second acoustic wave resonator.

11. The method of claim 10 wherein the ceramic layer comprises magnesium aluminate.

12. The method of claim 10 wherein the ceramic layer comprises polycrystalline aluminum nitride.

13. The method of claim 10 further comprising smoothing the surface of the ceramic layer prior to the bonding.

14. The method of claim 13 wherein the surface of the ceramic layer has a maximum surface roughness of 2 nanometers or less after the smoothing.

15. The method of claim 13 wherein the surface of the ceramic layer has an average surface roughness of 1 nanometer or less after the smoothing.

16. The method of claim 13 wherein the smoothing includes chemical-mechanical polishing.

17. The method of claim 10 further comprising smoothing a surface of the support substrate prior to the attaching.

18. The method of claim 10 wherein the piezoelectric layer has a thickness in a range from $3\lambda$ to $40\lambda$.

19. The method of claim 10 wherein the attaching includes applying an adhesive between the support substrate and the ceramic layer.

20. The method of claim 10 further comprising forming a temperature compensation layer over the first interdigital transducer electrode.

* * * * *